(12) United States Patent
Lee et al.

(10) Patent No.: US 7,687,860 B2
(45) Date of Patent: Mar. 30, 2010

(54) SEMICONDUCTOR DEVICE INCLUDING IMPURITY REGIONS HAVING DIFFERENT CROSS-SECTIONAL SHAPES

(75) Inventors: Woon-Kyung Lee, Gyeonggi-do (KR); Jeong-Hyuk Choi, Gyeonggi-do (KR); Dong-Jun Lee, Gyeonggi-do (KR); Jai-Hyuk Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 11/425,444

(22) Filed: Jun. 21, 2006

(65) Prior Publication Data
US 2006/0292802 A1    Dec. 28, 2006

(30) Foreign Application Priority Data
Jun. 24, 2005  (KR) ............... 10-2005-0055227
Mar. 7, 2006   (KR) ............... 10-2006-0021439

(51) Int. Cl.
*H01L 21/8239* (2006.01)

(52) U.S. Cl. .............. 257/361; 257/E21.455; 257/327; 257/390; 257/E21.209; 438/182

(58) Field of Classification Search ............ None
See application file for complete search history.

(56) References Cited

U.S. PATENT DOCUMENTS

| 2,890,395 | A | 6/1959 | Lathrop et al. | |
| 6,225,162 | B1 | 5/2001 | Lin et al. | |
| 7,307,311 | B2 * | 12/2007 | Fu | 257/330 |
| 2002/0089019 | A1 | 7/2002 | Fu | |
| 2004/0070021 | A1 * | 4/2004 | Yuan | 257/314 |
| 2004/0084698 | A1 * | 5/2004 | Ahn et al. | 257/268 |
| 2004/0150033 | A1 | 8/2004 | Kinoshita et al. | |
| 2005/0212034 | A1 * | 9/2005 | Sasago et al. | 257/315 |
| 2007/0096217 | A1 * | 5/2007 | Lee et al. | 257/369 |

FOREIGN PATENT DOCUMENTS

| JP | 03-283591 | 12/1991 |
| JP | 08-204056 | 8/1996 |
| JP | 09-321408 | 12/1997 |
| JP | 2001-284556 | 10/2001 |
| JP | 2002-246757 | 8/2002 |
| JP | 2004-022819 | 1/2004 |
| JP | 2004-214510 | 7/2004 |
| KR | 10-2001-0091532 A | 10/2001 |
| KR | 1020040003523 A | 1/2004 |

(Continued)

*Primary Examiner*—Minh-Loan T Tran
*Assistant Examiner*—Fei Fei Yeung Lopez
(74) *Attorney, Agent, or Firm*—Myers Bigel Sibley & Sajovec, P.A.

(57) ABSTRACT

There are provided a memory transistor having a select transistor with asymmetric gate electrode structure and an inverted T-shaped floating gates and a method for forming the same. A gate electrode of the select transistor adjacent to a memory transistor has substantially an inverted T-shaped figure, whereas the gate electrode of the select transistor opposite to the memory transistor has nearly a box-shaped figure. In order to form the floating gate of the memory transistor in shape of the inverted T, a region for the select transistor is closed when opening a region for the memory transistor.

15 Claims, 34 Drawing Sheets

FOREIGN PATENT DOCUMENTS

| | | |
|---|---|---|
| KR | 10-2004-0037327 A | 5/2004 |
| KR | 10-2005-0002244 A | 1/2005 |
| KR | 10-2005-0002304 A | 1/2005 |
| KR | 10-2005-0011501 A | 1/2005 |
| KR | 1020050029891 A | 3/2005 |
| KR | 100685177 B1 | 2/2007 |
| KR | 1020070029930 A | 3/2007 |
| TW | 584944 | 4/2004 |
| TW | 588455 | 5/2004 |
| TW | 594945 | 6/2004 |
| WO | WO2004/077902 A1 | 9/2004 |
| WO | WO2004/077903 A1 | 9/2004 |

\* cited by examiner

SEMICONDUCTOR DEVICE INCLUDING IMPURITY REGIONS HAVING DIFFERENT CROSS-SECTIONAL SHAPES

CLAIM FOR PRIORITY

This application claims priority to Korean Patent Application No. 2005-55227 and Korean Patent Application No. 2006-21439, filed on Jun. 24, 2005 and Mar. 7, 2006 respectively, the disclosures of which are incorporated herein in their entirety by reference.

FIELD OF THE INVENTION

The present invention relates to a semiconductor device and a method for forming the same, and more particularly, to a nonvolatile memory device and a method for forming the same.

BACKGROUND

Generally, a semiconductor memory device is classified into a volatile memory device and a nonvolatile memory device depending on whether or not it is necessary to supply power for retaining stored data. The volatile memory device such as a dynamic random access memory (DRAM) and a static RAM (SRAM) has a rapid operational speed but there is a limitation in that it is necessary to supply the power for retaining the data. On the contrary, since the nonvolatile memory device such as a flash memory device does not have such a limitation, it is widely used for a portable electronic device that demands have dramatically increased in recent years.

For example, the flash memory device includes a memory cell for playing a role in storing data, and a device related thereto such as a select transistor, a drive transistor, or the like. The memory cell of the flash memory device mainly employs a memory transistor, which is similar to a typical transistor. The memory transistor includes a gate stack structure and impurity regions disposed on both sides of the gate stack structure, wherein the gate stack structure is configured with a tunnel insulating layer, a floating gate, a gate interlayer insulating layer, and a control gate which are sequentially stacked on a channel region of a substrate. The floating gates of adjacent memory transistors are electrically insulated to each other, and each floating gate acts as a memory. The control gates of a plurality of memory transistors arranged in row direction are interconnected so as to act as a word line. The flash memory device may be mainly classified into a NAND type one and a NOR type one according to the arrangement scheme of the memory transistor having the above structure. In case of the NAND type flash memory device, a select transistor is connected to the memory transistor, and for example, the gates of the select transistors arranged in row direction are interconnected to thereby form a select line.

Meanwhile, it is necessary to heighten the integration degree in order to reduce the price of the semiconductor device, which causes several technical difficulties in manufacturing the semiconductor device. In particular, as the semiconductor device is highly integrated, the space between adjacent word lines are reduced also, which makes it difficult to improve the structure and characteristic of the nonvolatile memory device. For instance, although the nonvolatile memory device having the control gate electrode and the floating gate electrode should have a high coupling ratio for an effective operation, the reduction of the space between the word lines makes it difficult to secure such a high coupling ratio.

In addition, since the width of the word line and the space between the adjacent word lines are smaller than the width of the select line and the space between the select line and word line, the active region of the substrate where the select lines will be formed may be etch-damaged due to a loading effect.

With the increase of the integration degree of the memory device, the channel length of the select transistor decreases also, which causes a short channel effect. For example, a punchthrough may occur with ease because a channel doping concentration is relatively higher in the edge portion than in the central portion of the channel region. Further, there is great likelihood that the punchthrough occurs at the memory transistor adjacent to the select transistor.

SUMMARY

Embodiments of the present invention provide semiconductor devices including: a first gate formed on an active region of a substrate, wherein the active region is defined by device isolation layer patterns; a first insulating layer formed between the first gate and the active region; and first and second impurity regions formed on the active region on both sides of the first gate, wherein a first portion of the first gate adjacent to the first impurity region is different in cross-sectional shape from a second portion of the first gate adjacent to the second impurity region.

In some embodiments of the present invention, the first portion of the first gate has substantially an inverted T-shaped section and the second portion of the first gate has a box-shaped section when taken along a direction crossing the active region and the device isolation layer patterns.

In other embodiments of the present invention, there are provided NAND flash memory devices including: a select transistor formed on an active region of a substrate, wherein the active region is defined by device isolation layer patterns; and a plurality of memory transistors formed on the active region, the plurality of memory transistors being operatively connected to the select transistor in series, wherein the select transistor and each of the plurality of memory transistors include a stack gate stricture configured with a first insulating layer, a first gate, a second insulating layer, and a second gate which are sequentially formed on the active region, in which a first gate of the memory transistor is substantially identical in cross-sectional shape to a first portion of the first gate of the select transistor adjacent to the memory transistor, and a second portion of the first gate of the select transistor opposite to the memory transistor is different in cross-sectional shape from the first portion of the first gate of the select transistor.

In further embodiments of the present invention, there is provided a method for forming a semiconductor device, the method including: forming a first insulating layer and a first conductive layer pattern on an active region of a substrate, wherein the active region is defined by a device isolation layer pattern; etching a portion of the device isolation layer pattern downwardly to form a lowered device isolation layer pattern which covers a side surface of a lower pattern of the first conductive pattern; etching side surfaces of an upper pattern of the first conductive layer pattern to form a narrowed upper pattern of which a width is less than the width of the lower pattern of the first conductive pattern, wherein the upper pattern of the first conductive pattern is protruded upwardly higher than the lowered device isolation layer pattern; patterning the first conductive pattern having the lower pattern and the narrowed upper pattern to form a first gate having a first portion and a second portion, wherein the first portion is patterned from the lower pattern and the upper pattern, and a second portion is patterned from the first conductive layer adjacent to the device isolation layer pattern; and forming a first impurity region and a second impurity region which are adjacent to the first portion and the second portion of the first gate, respectively.

In yet other embodiments of the present invention, there are provided methods for forming a NAND flash memory device, the methods including: forming a first insulating layer and a first conductive layer pattern on an active region of a substrate, wherein the active region is defined by a device isolation layer pattern extended in a first direction; downwardly etching the device isolation layer pattern of a first region of the substrate where a memory transistor is formed, to form a lowered device isolation layer pattern which covers a side surface of a lower pattern of the first conductive pattern; etching side surfaces of an upper pattern of the first conductive layer pattern to form a narrowed upper pattern of which a width is less than the width of the lower pattern of the first conductive pattern, wherein the upper pattern of the first conductive pattern is protruded upwardly higher than the lowered device isolation layer pattern; forming a second insulating layer and a second conductive layer on the device isolation layer pattern, the lowered device isolation layer pattern and the first conductive layer pattern; and patterning the second conductive layer, the second insulating layer, and the first conductive layer to form a control gate of the memory transistor from the second conductive layer, a gate interlayer insulating layer of the memory transistor from the second insulating layer, and a floating gate of the memory transistor from the lower and upper patterns of the first conductive layer pattern in the first region, wherein the control gate of the memory transistor extends in a second direction perpendicular to the first direction and crosses over the active region and the lowered device isolation layer pattern.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DESCRIPTION OF EMBODIMENTS ACCORDING TO THE INVENTION

Figure 1:
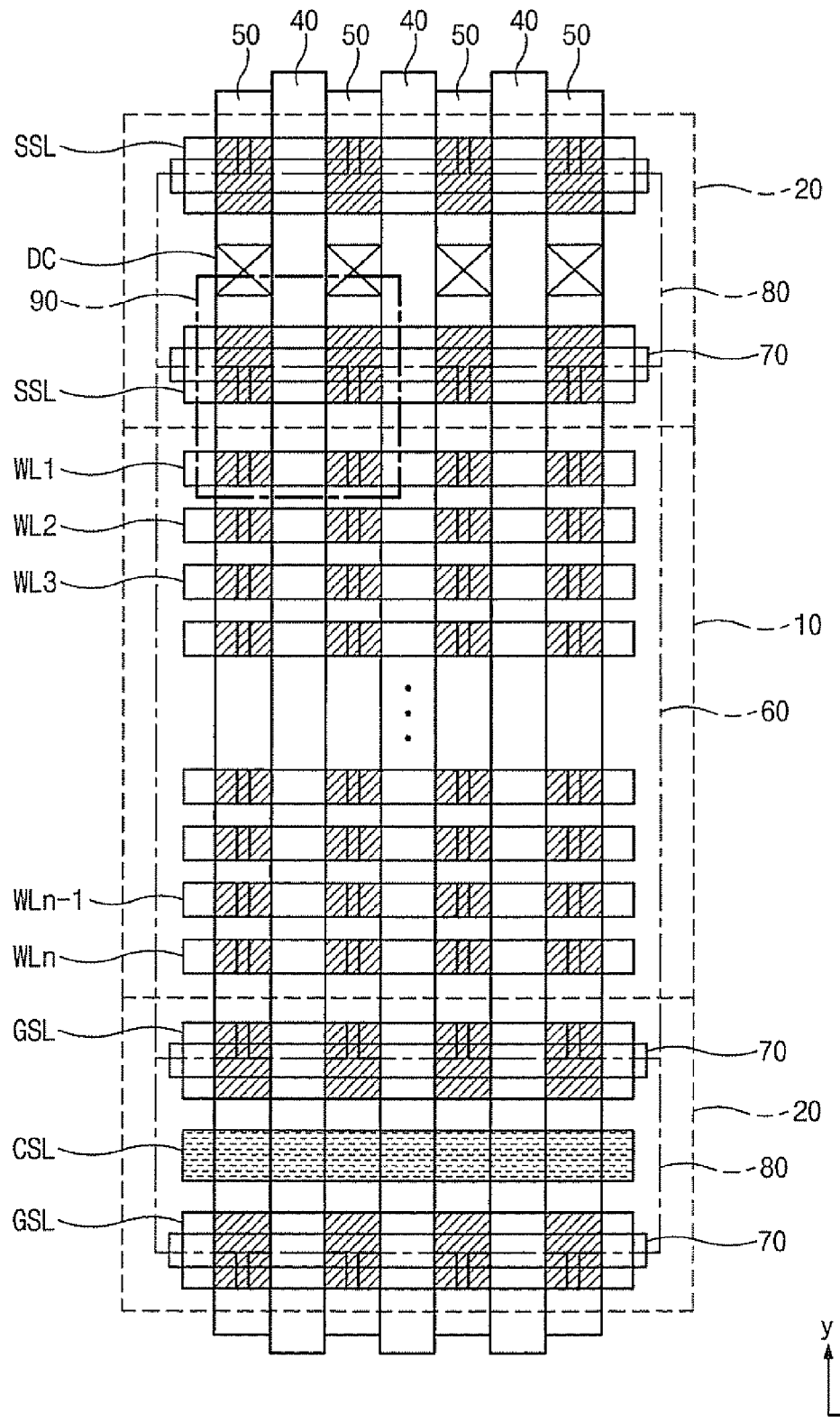
FIG. 1 is a schematic plane view illustrating a NAND flash memory device according to one embodiment of the present invention.

Reference will now be made in detail to the embodiments according to the present invention, examples of which are illustrated in the accompanying drawings. However, the present invention is not limited to the embodiments illustrated herein after, and the embodiments herein are rather introduced to provide easy and complete understanding of the scope and spirit of the present invention. In the drawings, the thickness of layers and regions are exaggerated for clarity. It will also be understood that when a layer is referred to as being on another layer or substrate, it can be directly on the another layer or substrate, or intervening layers may also be present.

In the drawings, the size of the element or relative sizes among the elements may be more or less exaggerated for more definitely illustrating the present invention. In addition, the shape of the element illustrated in the drawings may be slightly modified according to various changes in fabrication processes. Therefore, embodiments disclosed in the specification should not be construed as being limited to the shape depicted in the drawings but it should be construed that they be modified to some degree if no specific mention is given in the specification. For instance, it should be understood that the term such as 'substantially', 'about', etc, which is used in describing the shape of the element in the specification, means the element may be modified within the scope of the allowable process change.

It will be understood that, as used herein, the terms "row" and "column" are used to denote two different directions on a substrate face, rather than indicating an absolute horizontal or vertical direction. In some embodiments, the rows are parallel with an x-axis, and the columns are parallel with a y-axis or vice versa.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention relates to a semiconductor device and a method for fabricating the same, and particularly, a NAND flash memory device will be illustrated in the main as an example of the embodiments of the present invention. The NAND flash memory device of the present invention includes a plurality of memory cells and select transistors related thereto. The select transistor plays a role in applying or interrupting a required operational voltage to a memory transistor when the NAND flash memory device operates. As the memory cell, a memory transistor having a stack gate structure will be illustrated as an example. The stack gate structure of the memory transistor includes a floating gate insulated from a substrate (a channel region) by a tunneling insulating layer, a control gate insulated from the floating gate by a gate interlayer insulating layer. Charges move into the floating gate through the tunneling insulating layer from the substrate, or vice versa, when applying an appropriate operational voltage to the substrate, a source, a drain, and the control gate. In virtue of the charge movement, the memory transistor has at least two distinguishable threshold voltage levels, which correspond to logic states.

Although the select transistor is similar in gate structure to the memory transistor because it has the floating gate and the control gate, the select transistor is different from the memory transistor because the floating gate and the control gate are electrically connected to each other through, for example a butting contact. In illustrating the embodiments of the present invention, the 'floating gate' of the select transistor may be referred to as a 'first gate', and the 'control gate' of the select transistor may be referred to as a 'second electrode'.

A predetermined number of memory transistors, e.g., 16, 32, ..., $2^m$ number of the memory transistors, are connected in series so as to form a memory string. A first select transistor and a second select transistor are connected to the first and last memory transistors of the memory string, respectively. A bit line and a common source line may be connected to the first select transistor and the second select transistor, respectively.

FIG. 1 is a schematic plane view illustrating a NAND flash memory device according to one embodiment of the present invention. Referring to FIG. 1, the NAND flash memory device includes a memory transistor and a select transistor operationally coupled to the memory transistor. For the sake of illustrative convenience, a region 10 where the memory transistor is formed will be referred to as a "first region", and a region 20 where the select transistor is formed will be referred to as a "second region" in illustrating the embodiment of the present invention, hereinafter.

A plurality of device isolation layer patterns 40 extended in a first direction, for example in a row direction are arranged on a semiconductor substrate 30. Respective active region 50 is defined between the isolation patterns 40 such that it is extended in the first direction. The memory transistor is formed on the active region of the first region 10 and the select transistor is formed on the active region of the second region 20. Herein, n number of the memory transistors are connected in series on each active region extended in the first direction in the first region 10 to thereby form a memory string. The control gates of the plurality of memory transistors arranged in a second direction, for example column direction are interconnected so as to form word lines WL0~WLn correspondingly. Alternatively, the control gates of the plurality of memory transistors arranged in each column may be connected to a word line.

The select transistor is formed in the second region 20 such that it is connected to the memory transistor of the first region 10. For instance, a first select transistor (a string select transistor) is connected to the first memory transistor of each memory string in series, and a second select transistor (a ground select transistor) is connected to the last memory transistor of each memory string in series. The second gates of the first select transistors arranged in row direction in the second region 20 are interconnected to thereby form a first select line (or a string select line SSL). In addition, the second gates of the second select transistors arranged in row direction in the second region 20 are interconnected to thereby form a second select line (or a ground select line GSL). Herein, the first gate and second gate of each select transistor are electrically connected to each other through a butting contact 70.

A complex structure configured with the string select line SSL, the ground select line GSL, and the plurality of word lines WL0~WLn disposed therebetween is mirror-symmetrically and repeatedly arranged on the semiconductor substrate 30. A common source line CSL is disposed between the adjacent second select lines GSL, and an operational voltage, e.g., 0 V, applied to the ground select line GSL is transferred to the source/drain of the memory transistor depending on whether the second select transistor is turned on or off. A bit line contact DC is disposed in each active region between the adjacent first select lines SSL, and the bit line is electrically connected to each bit line contact DC. An operational voltage applied to the bit line is applied to the source/drain of the memory transistor depending on whether the first select transistor is turned on or off.

A region 60 denoted as dot line in FIG. 1 is provided with the first region 10 and a portion of the second region 20 which is adjacent to the first region 10, wherein the region 60 is referred to as an "inverted T-shaped gate region", hereinafter. The first gate of the select transistor and the floating gate of the memory transistor formed which are formed in the inverted T-shaped gate region 60 have inverted T-shaped sections, respectively. For the sake of illustrative convenience, a region 80 in the second region 20 except the inverted T-shaped gate region 60 is referred to as a "box-shaped gate region", hereinafter.

Figure 2:
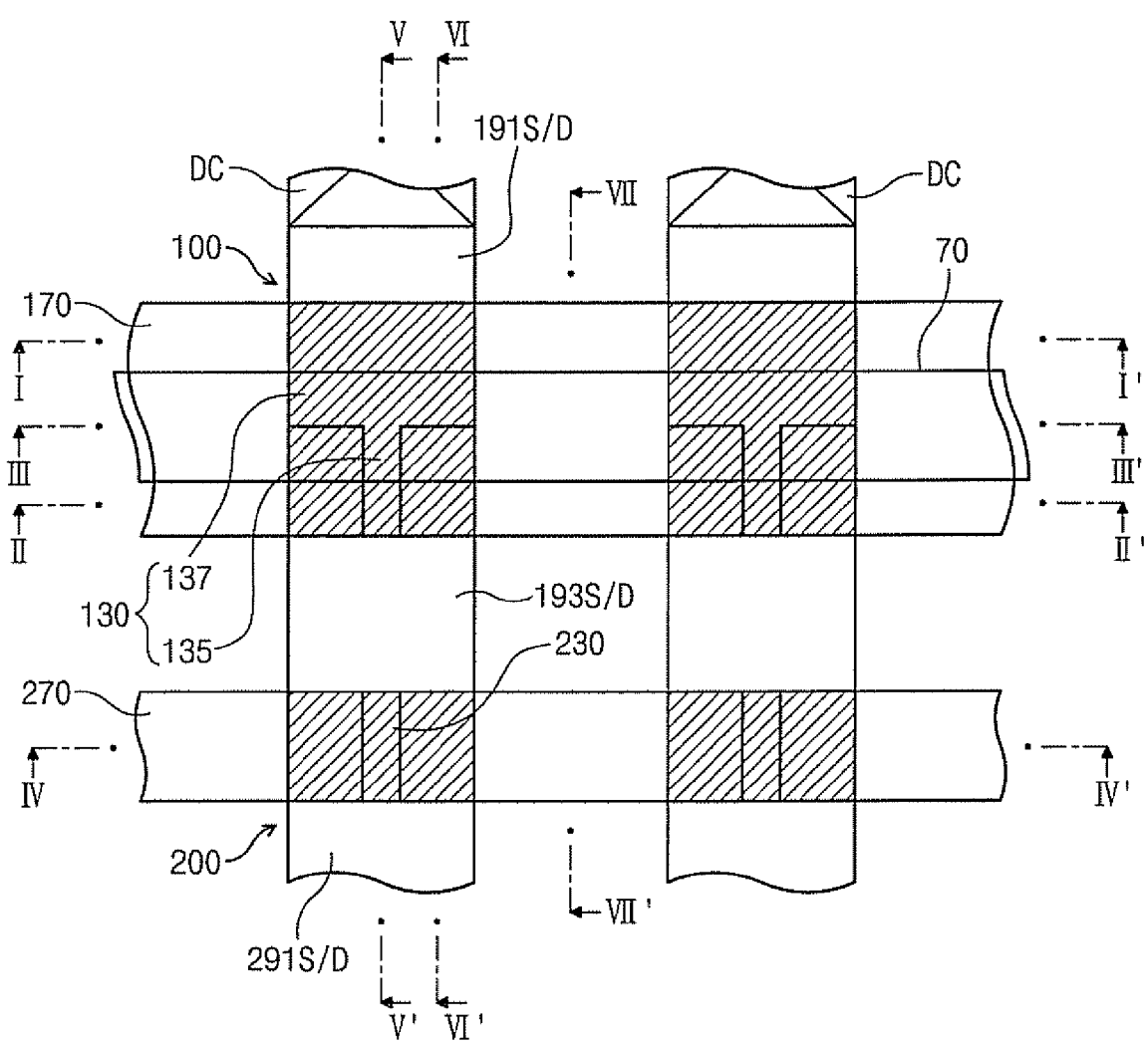
FIG. 2 is a partial enlarged view illustrating a region of the reference numeral 90 of FIG. 1, which is a boundary region between a first region 10 where a memory transistor is formed and a second region 20 where a select transistor is formed.

FIG. 2 is a partial enlarged view illustrating a region 90 of FIG. 1, which is a boundary region between the first region 10 where the memory transistor is formed and the second region 20 where the select transistor is formed. Referring to FIG. 2, the select transistor 100 includes a gate stack structure and impurity regions 191S/D and 193S/D formed on the active region at both sides of the gate stack structure, wherein the gate stack structure is configured with a first gate 130 and a second gate 170 electrically connected to each other. Meanwhile, the memory transistor 200 includes a gate stack structure and impurity regions 193S/D and 291S/D formed on the active region at both sides of the gate stack structure, wherein the gate stack structure is configured with a floating gate 230 and a control gate 270 insulated from the floating gate 230 by means of a gate interlayer insulating layer. The floating gate 230 of the memory transistor 200 is different in structure from the first gate 130 of the select transistor 100. In detail, the first gate 130 of the select transistor 100 can be divided into two portions, one of which is a first portion 135 which is similar in structure to the floating gate 230 of the memory transistor 200 and the other of which is a second portion 137 which is different in structure from the floating gate 230. The first portion 135 of the first gate 130 is disposed adjacent to the memory transistor, i.e., adjacent to the impurity region 193S/D. Whereas, the second portion 137 of the first gate 130 is disposed adjacent to the bit line contact DC which is opposite to the memory transistor 200, i.e., adjacent to the impurity region 191S/D.

The select transistor and the memory transistor according to one embodiment of the present invention will be more fully illustrated with reference to FIGS. 3 to 9 herebelow.

Figure 3:
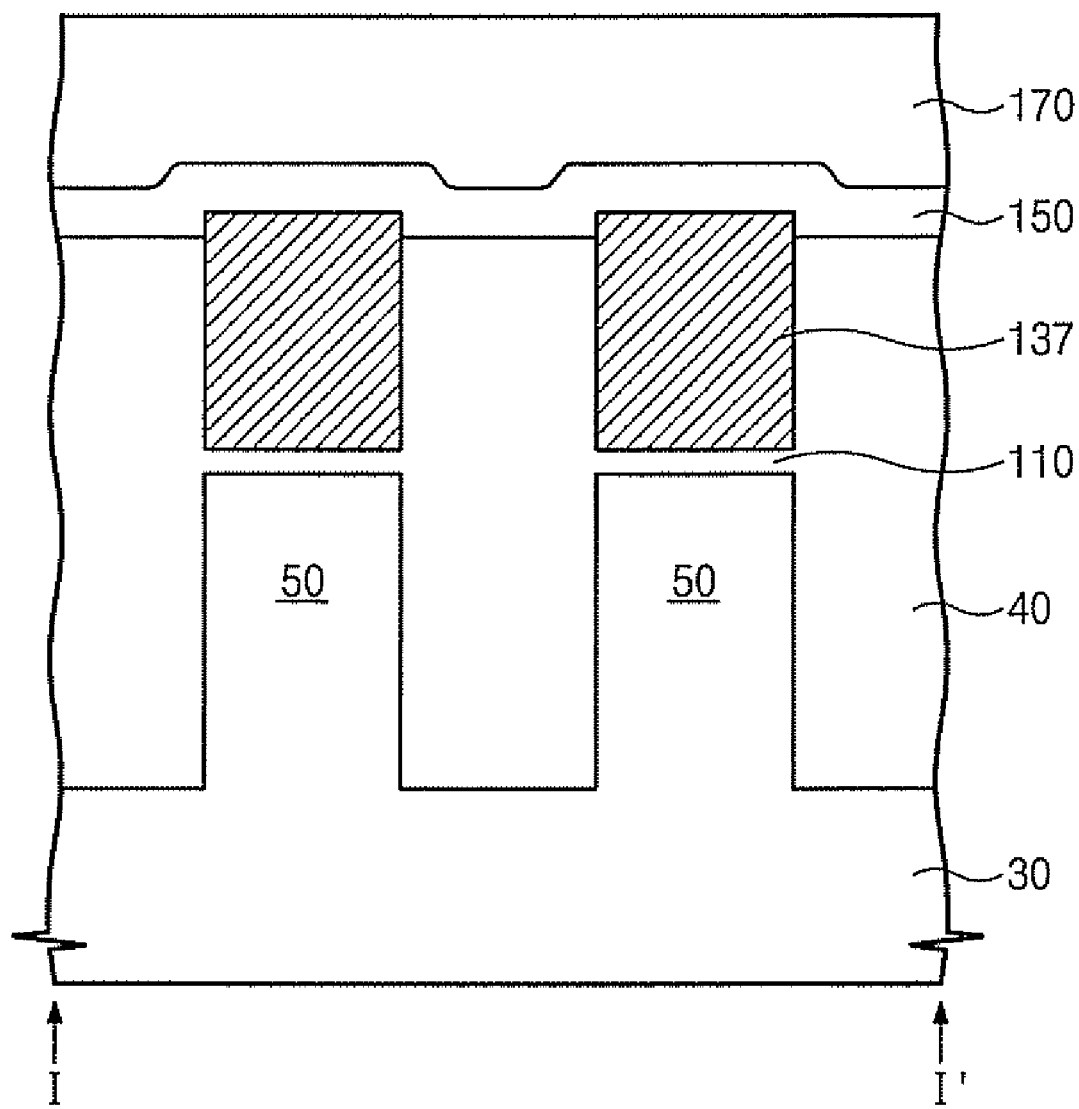
FIGS. 3 to 8 are cross-sectional views taken along the lines I-I', II-II', III-III', IV-IV', V-V', AND VI-VI' of FIG. 2, respectively.
Figure 4:
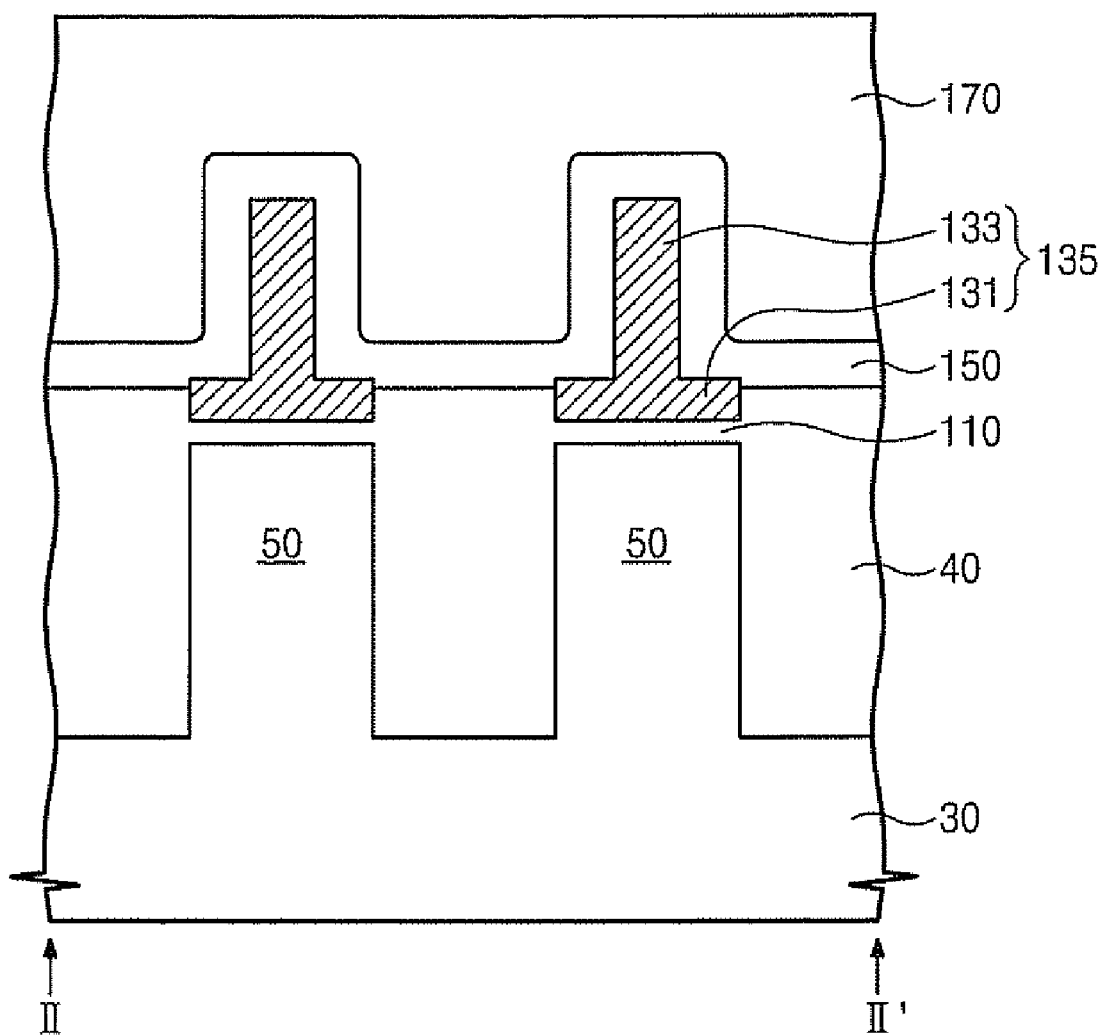
Figure 5:
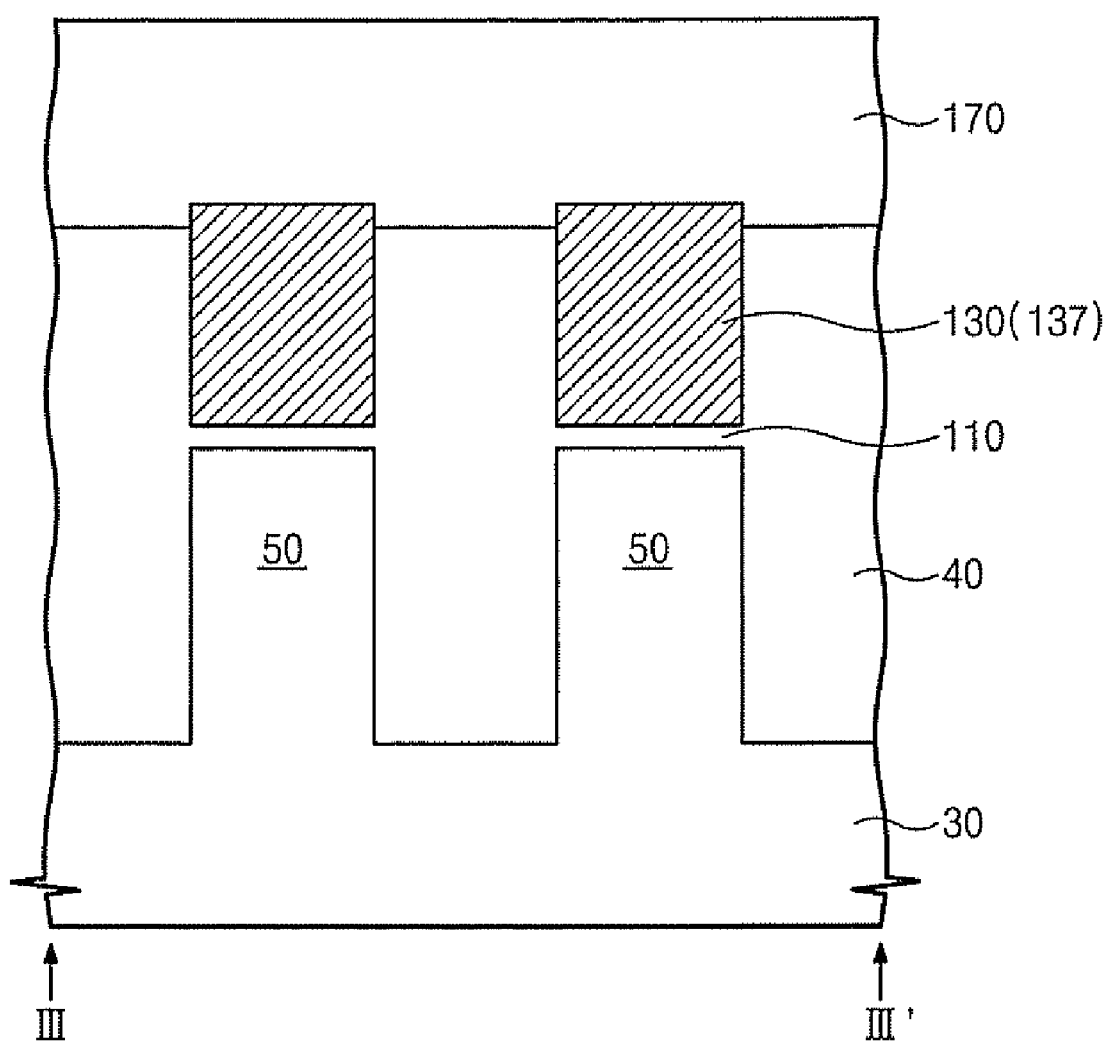

FIG. 3 is a cross-sectional view taken along the line I-I' of FIG. 2, i.e., a predetermined direction passing through the device isolation layer 40 and the active region 50 in the box-shaped gate region 80 of the second region 20, in order to show the cross-sectional view of the second portion 137 of the first gate 130 of the select transistor 100. FIG. 4 is a cross-sectional view taken along the line II-II' of FIG. 2, i.e., a predetermined direction passing through the device isolation layer 40 and the active region 50 in the inverted T-shaped gate region 60 of the second region 20, in order to show the cross-sectional view of the first portion 135 of the first gate 130 of the select transistor 100. FIG. 5 is a cross-sectional view taken along the line II-III' of FIG. 2, i.e., a predetermined direction passing through the device isolation layer 40 and the active region 50 in the butting contact region 70 of the second region 20, in order to show the electrical connection between the first gate 130 and the second gate 170 of the select transistor 100.

Referring to FIG. 3, the second portion 137 of the first gate 130 of the select transistor 100 has a shape like a box. However, referring to FIG. 4, the first portion 135 of the first gate 130 of the select transistor 100 has substantially a shape like an inverted T. The first portion 135 of the first gate 130, for instance, may be divided into a horizontal portion 131 and a vertical portion 133 which is connected to the horizontal portion 131 and extended upward with respect to the substrate 30, wherein the vertical portion 133 is smaller in width than the horizontal portion 131. A first insulating layer 110 is disposed between the first gate 130 of the select transistor 100 and the active region 50. Referring to FIG. 5, the first gate 130 and the second gate 170 are electrically connected to each other through a predetermined region of the second insulating layer 150, i.e., a butting contact region.

Referring to FIGS. 3 to 5, the top surface of the device isolation layer 40 adjacent to the second portion 137 of the first gate 130 is substantially equal in height to the top surface of the second portion 137 of the first gate 130 in the box-shaped gate region 80 of the second region 20. That is, the device isolation layer 40 covers the side surface of the second portion 137 of the first gate 130 mostly in the second region 20. However, referring to FIG. 4, the top surface of the device isolation layer 40 adjacent to the first portion 135 of the first gate 130 is substantially equal in height to the top surface of the horizontal portion 131 of the first portion 135 in the inverted T-shaped gate region 60. The device isolation layer, which is relatively higher in the box-shaped gate region 80, plays a role in preventing the active region from being etch-damaged during a gate-patterning process.

Figure 6:
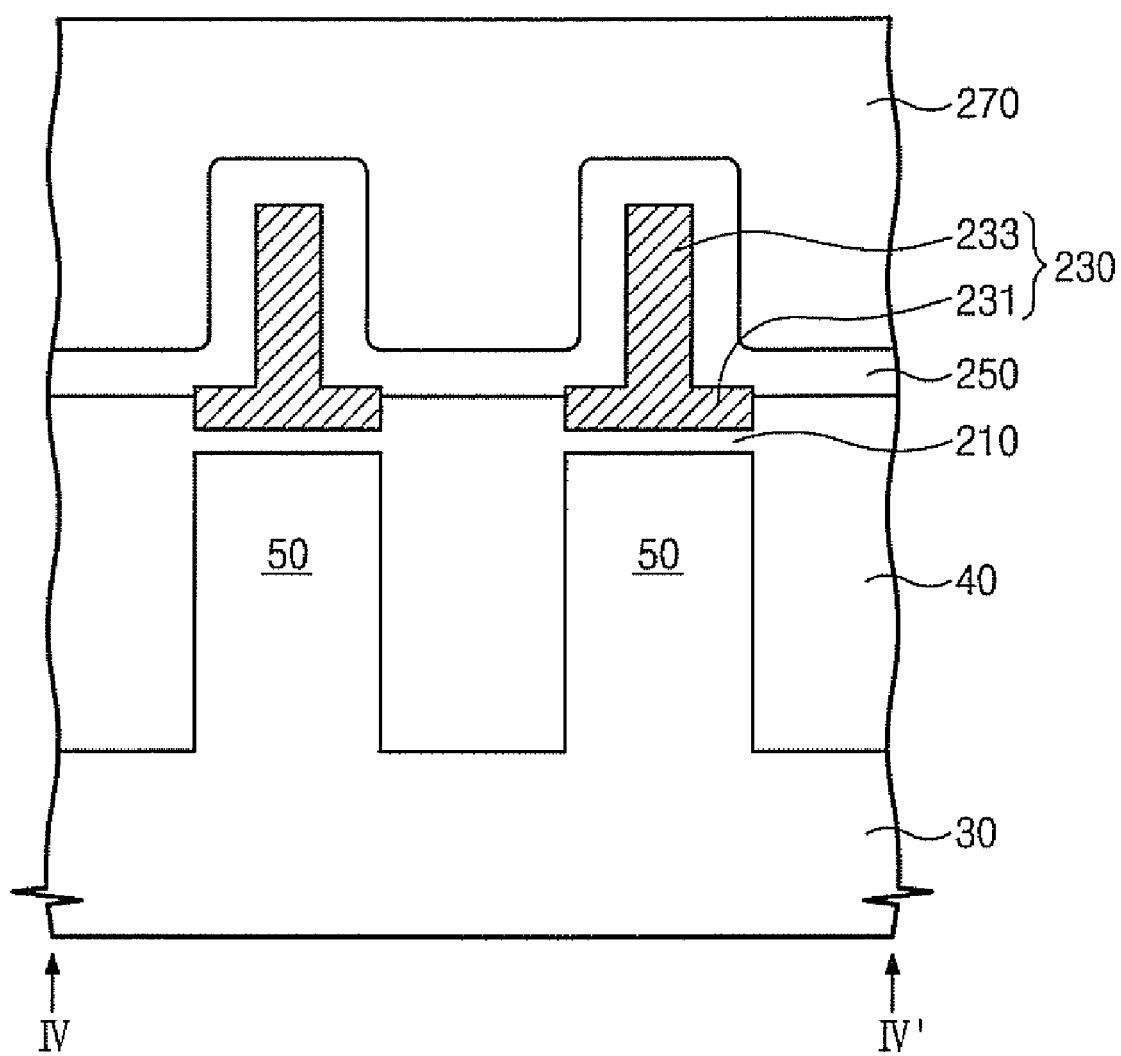

FIG. 6 is a cross-sectional view taken along the line IV-IV' of FIG. 2, i.e., a predetermined direction passing through the device isolation layer 40 and the active region 50 in the first region 10, in order to show the cross-sectional view of the floating gate 230 of the memory transistor 200. Referring to FIG. 6, the floating gate 230 of the memory transistor 200 has an inverted T-shaped section. For instance, the floating gate 230 may be divided into a horizontal portion 231 and a vertical portion 233, which is connected to the horizontal portion 231 and extended upward with respect to the substrate 30, wherein the vertical portion 233 is smaller in width than the horizontal portion 231. In the specification, the horizontal portion 231 and the vertical portion 233 of the floating gate of the memory transistor may be referred to as a lower conductive pattern and an upper conductive pattern, respectively. A tunneling insulating layer 210 is disposed between the floating gate 230 and the active region 50. The floating gate 230 and the control gate 270 are insulated from each other by means of a gate interlayer insulating layer 250 interposed therebetween. The top surface of the device isolation layer 40 adjacent to the floating gate 230 is substantially equal in height to the top surface of the horizontal portion 231 of the floating gate 230.

The height of the device isolation layer 40 may be variously modified according to embodiments, while maintaining the device isolation layer 40 formed on the box-shaped gate region 80 of the second region 20 to be higher than the device isolation layer 40 formed in the inverted T-shaped gate region 60. For example, the device isolation layer 40 is formed in the first region 10 such that it may be lower than the active region 50 or it may be higher than the top surface of the horizontal portion 231 of the floating gate 230.

The first insulating layer 110 of the select transistor and the tunneling insulating layer 210 of the memory transistor may be formed from the same layer. For example, the first insulating layer 110 and the tunneling insulating layer 210 may be formed of a silicon oxide layer having a thickness in range of 20 Angstroms to 200 Angstroms. However, it is not limited to the above so that it may be formed of a metal insulating layer with high dielectric constant also. The first gate 130 of the select transistor and the floating gate 230 of the memory transistor may be formed from the same layer. For example, the first gate 130 and the floating gate 230 may be formed of silicon. Likewise, the second gate 170 of the select transistor and the control gate 270 of the memory transistor may be formed from the same layer. For example, the second gate 170 and the control gate 270 may be formed of silicon, silicide, metallic material or combination thereof. The second insulating layer 150 of the select transistor and the gate interlayer insulating layer 250 of the memory transistor may be formed from the same layer. For example, the second insulating layer 150 and the gate interlayer insulating layer 250 may be a multilayer configured with a silicon oxide layer having a thickness in range of 30 Angstroms to 80 Angstroms, a silicon nitride layer having a thickness in range of 50 Angstroms to 150 Angstroms, and a silicon oxide layer having a thickness in range of 30 Angstroms to 100 Angstroms.

Figure 7:
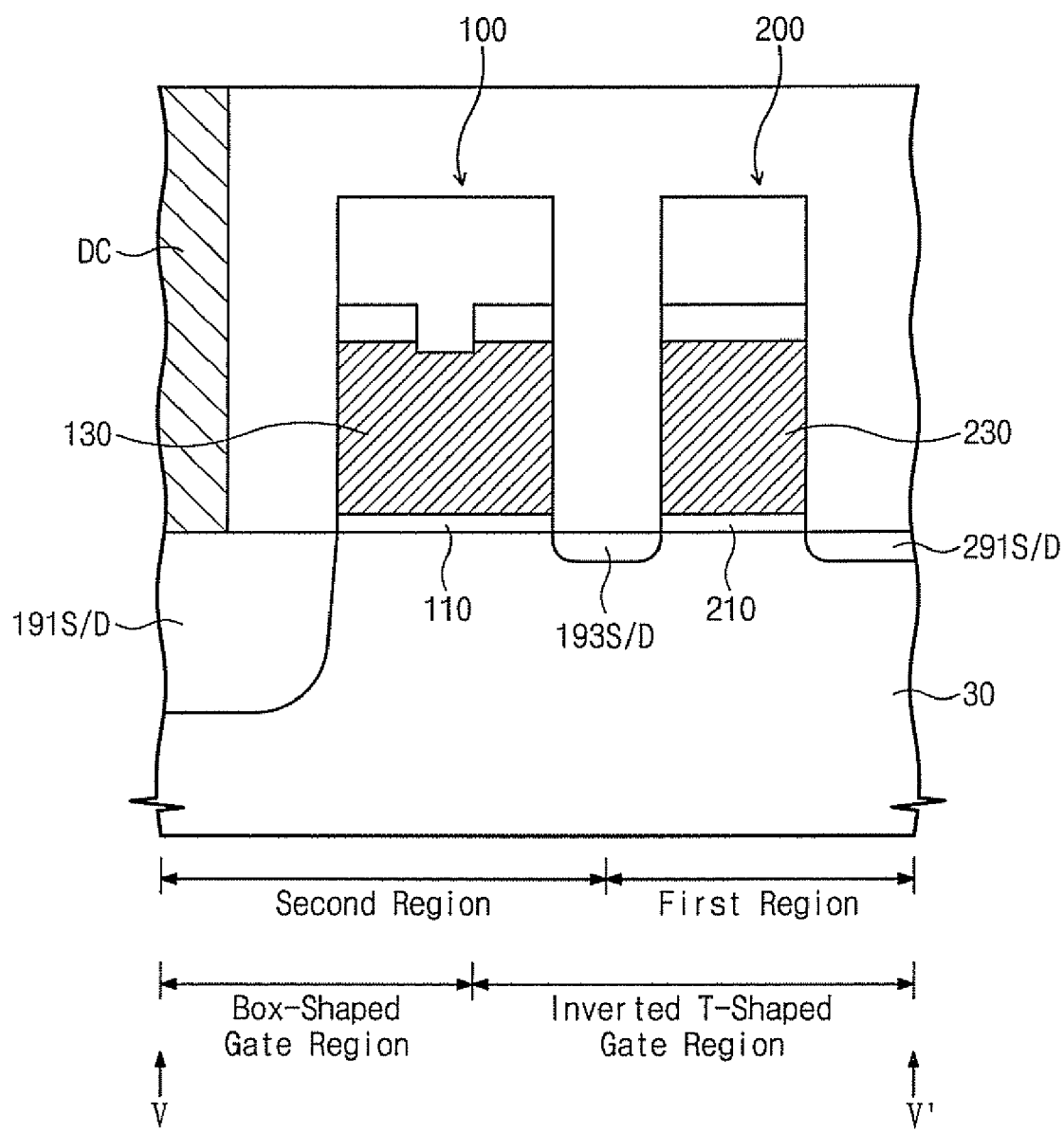
Figure 8:
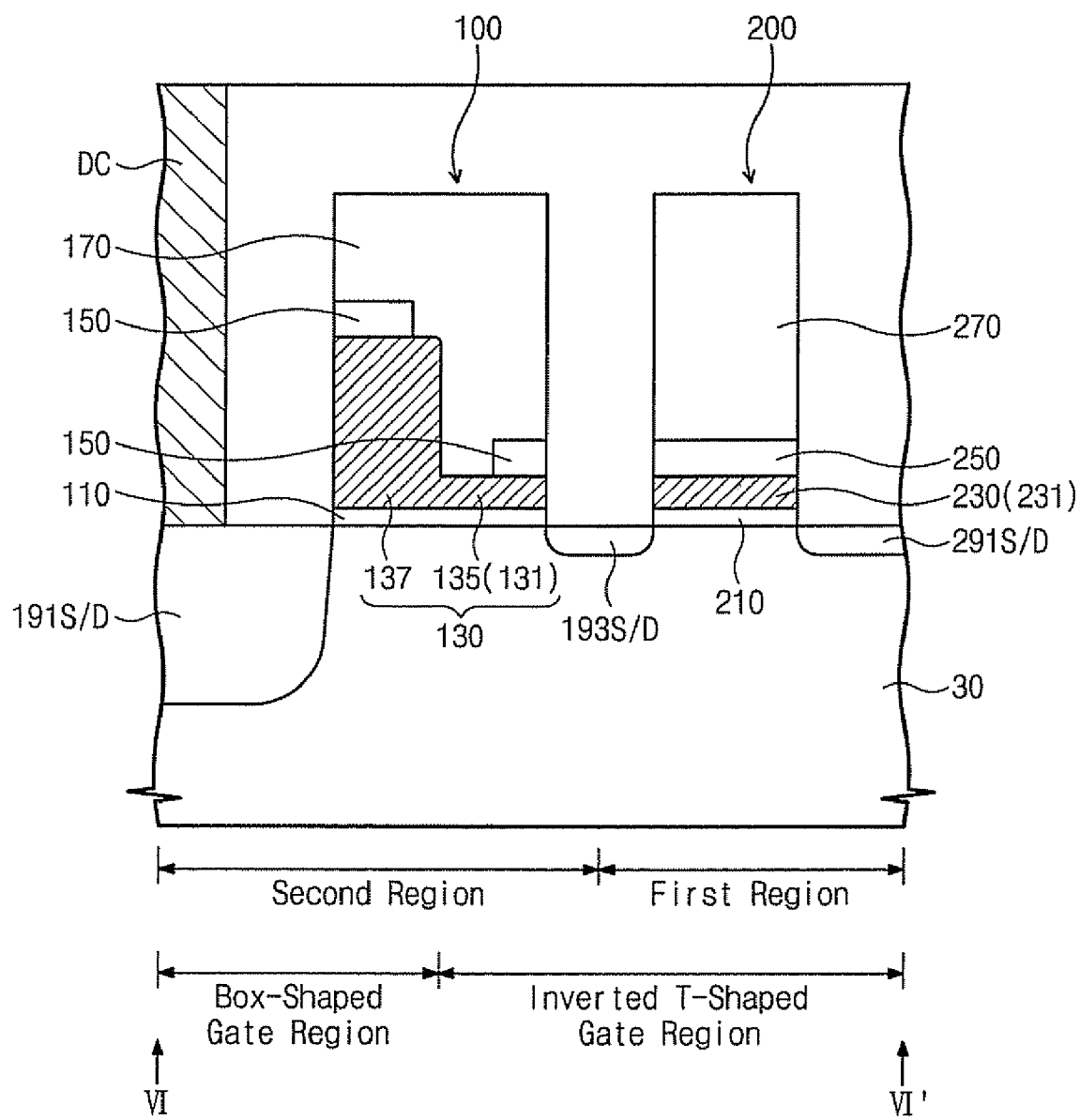

FIGS. 7 and 8 are cross-sectional views of the memory transistor and the select transistor taken along the direction along which active region 50 extends (lines V-V' and VI-VI' of FIG. 2), respectively. Referring to FIGS. 7 and 8, the select transistor 100 includes the impurity regions 191S/D and 193S/D, which are asymmetrically formed. Herein, the asymmetry of the impurity regions means that one impurity region may be different in doping concentration and or different in depth from the surface of the substrate from the other impurity region. The impurity region 191S/D adjacent to the second portion 137, i.e., adjacent to the drain contact DC, is higher in doping concentration and deeper in junction depth than the impurity region 193S/D adjacent to the first portion 135 of the first gate 130 of the select transistor 100, i.e., adjacent to the memory transistor 200.

Since the impurity region 193S/D adjacent to the memory transistor 200 has relatively low doping concentration and shallow junction depth, it is possible to reduce the effect of channel hot electron and/or the effect of gate induced drain leakage (GDL) generated in the channel region under the memory transistor 200 while the memory device is operating. Meanwhile, since the impurity region 191S/D adjacent to the drain contact DC has relatively high doping concentration and deep junction depth, the junction leakage current may be minimized so as to improve pressure-resistant characteristic. In addition, it is possible to form a silicide layer with good property on the impurity region 191S/D adjacent to the drain contact DC.

Furthermore, a first portion of a channel region below the first portion 135 of the first gate 130 may be different in channel doping concentration from a second portion of the channel region below the second portion 137 of the first gate 130 in the select transistor 100. For example, the channel doping concentration under the first portion 135 of the first gate 130 is higher than the channel doping concentration under the second portion 137. That is, the second portion 137 is formed thickly in shape of a box, whereas the first portion 135 is formed relatively thinner than the second portion 137 because it has an inverted T-shape. Therefore, it is possible to appropriately control the doping concentration of the channel region under the first portion 135 with ease. Since the channel doping concentration can be controlled, it is possible to suppress the punchthrough of the select transistor 100 caused by the high integration of the device. For instance, the channel doping concentration of the channel region under the thin horizontal portion 131 may be increased by injecting impurity ions into the channel region through the horizontal portion 131 by ion-implantation process. Since the floating gate 230 of the memory transistor 200 also has the horizontal portion 231, it is possible to easily control the doping concentration of the channel region through the horizontal portion 231 by ion-implantation process.

Figure 9A:
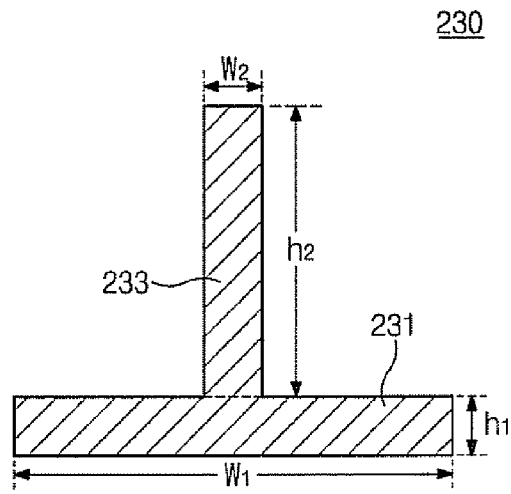
FIG. 9A is a schematic cross-sectional view of a floating gate electrode taken along an extension direction of a control gate according to one embodiment of the present invention.
Figure 9B:
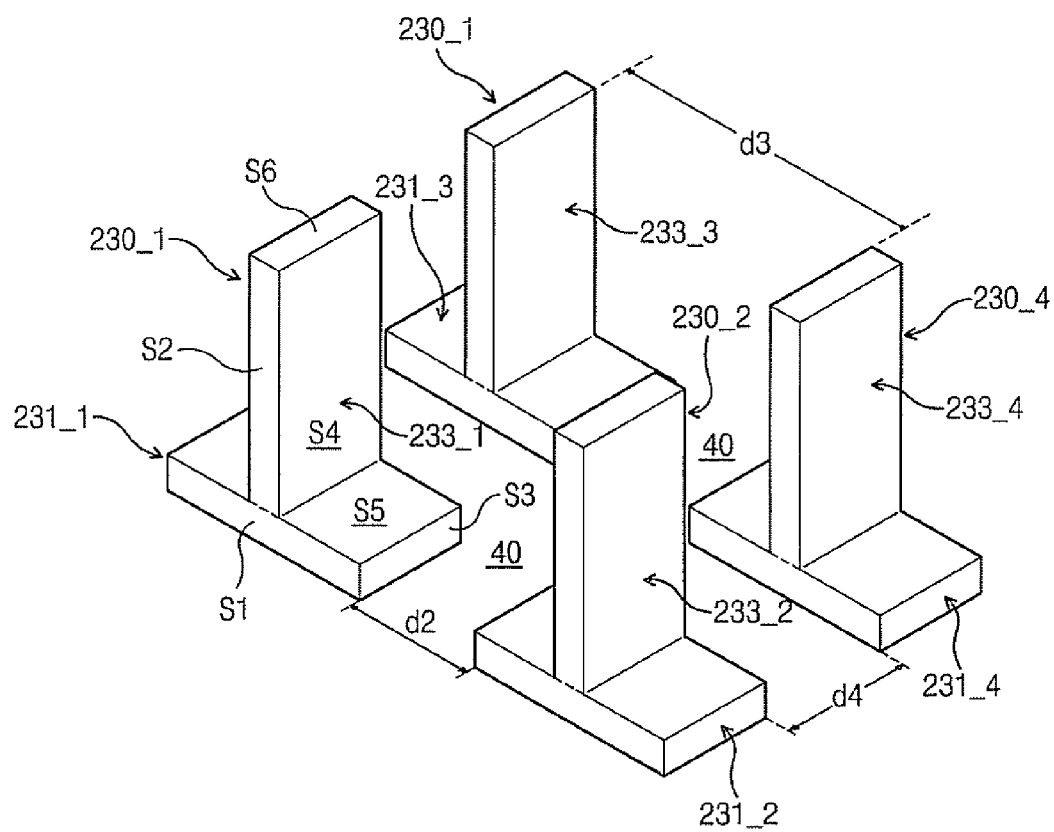
FIG. 9B is a perspective view illustrating the arrangement of the floating gate electrodes according to one embodiment of the present invention.
Figure 10:
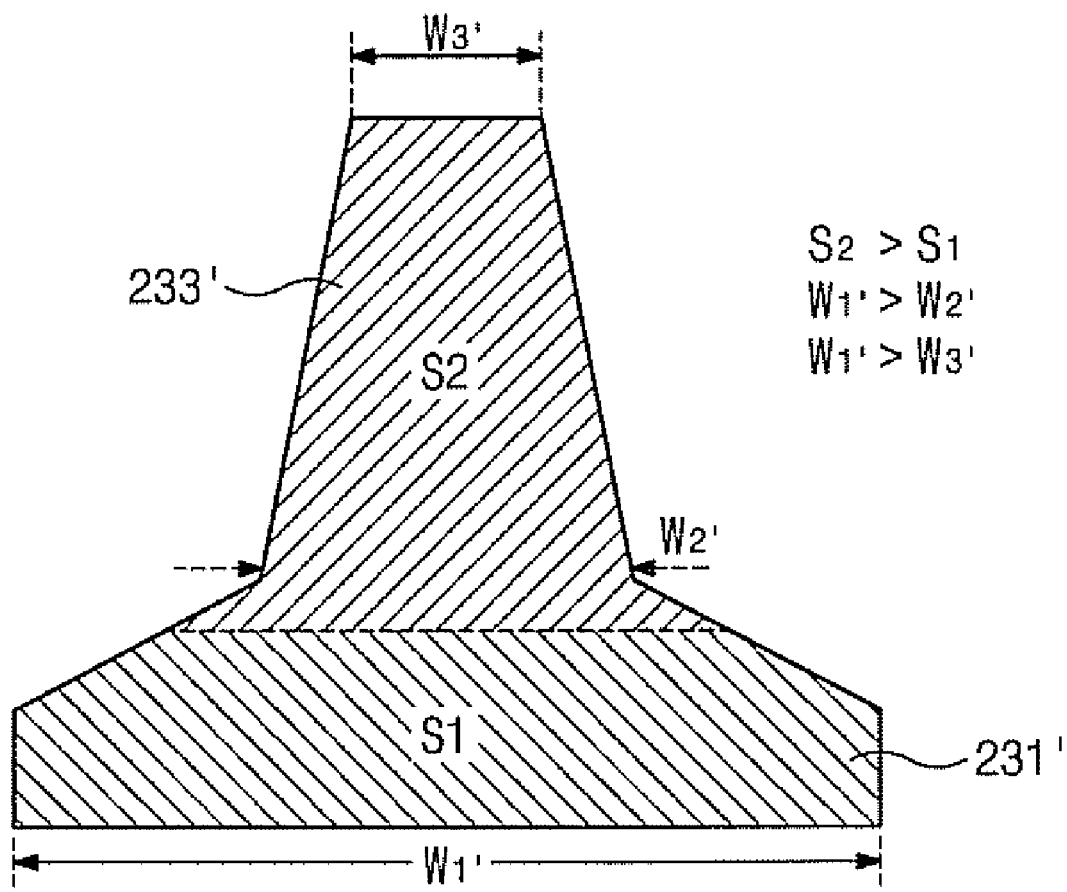
FIG. 10 is a schematic cross-sectional view of a floating gate electrode according to another embodiment of the present invention.

The memory transistor according to one embodiment of the present invention will be illustrated in detail with reference to FIGS. 9A, 9B and 10, herebelow. FIG. 9A is a schematic cross-sectional view of the floating gate taken along the column direction (along which the control gate extends), and FIG. 9B is a perspective view illustrating the arrangement of the floating gate. In FIG. 9, there are shown only four floating gates for the sake of illustrative convenience.

Referring to FIG. 9A, the floating gate electrode 230 according to the embodiment of the present invention includes the horizontal portion 231 and the vertical portion 233. In the embodiment, the horizontal portion 231 and the vertical portion 233 are formed from the same layer. The vertical portion 233 is protruded from a predetermined portion of the top surface of the horizontal portion 231. The width $w_2$ of the vertical portion 233 is less than the width $w_1$ of the horizontal portion 231, and the thickness $h_2$ of the vertical portion 233 is greater than the thickness $h_1$ of the horizontal portion 231. Meanwhile, the cross-sectional area $S_2$ of the vertical portion 233 is larger than the cross-sectional area $S_1$ of the horizontal portion 231, where $S_1=w_1 \times h_1$, and $S_2=w_2 \times h_2$.

In order to embody a highly integrated semiconductor device, it is desirable to form the horizontal portion 231 as narrow as possible. It is preferable that the thickness $h_1$ of the horizontal portion 231 is as small as possible in order to minimize the interference between the horizontal portions adjacent to each other in row direction and/or the interference between the horizontal portions adjacent to each other in column direction. According to embodiment of the present invention, the thickness $h_1$ of the horizontal portion 231 can be dependent upon thin film deposition process technology and etching process, thus the horizontal portion 231 may be formed very thinly. Meanwhile, the vertical portion 233 may be formed as narrow as possible in order to increase the space between the adjacent vertical portions. According to the embodiment, it is possible to control the width $w_2$ of the vertical portion 233 such that it has a desired width by appropriately controlling the etching condition, e.g., etching time. Satisfying such conditions that the cross-sectional area $S_2$ of the vertical portion 233 is greater than the cross-sectional area $S_1$ of the horizontal portion 231 and the width $w_2$ of the vertical portion 233 is less than the width $w_1$ of the horizontal portion 231, it is possible to appropriately vary the widths and thicknesses of the vertical and horizontal portion 233 and 231 such that they are adaptive for embodying a device with high coupling ratio and high integration degree.

The effect or advantages of the floating gate electrode according to the embodiment of the present invention will be described herebelow with reference to FIG. 9B. For the sake of illustrative convenience, the four floating gate electrodes are called a first floating gate electrode 230_1, a second floating gate electrode 230_2, a third floating gate electrode 230_3, and a fourth floating gate electrode 230_4, respectively. The first and second floating gate electrodes 230_1 and 230_2 are arranged in the first row, and the third and fourth floating gate electrodes 230_3 and 230_4 are arranged in the second row. The first and third floating gate electrodes 230_1 and 230_3 are arranged in the first column, and the second and fourth floating gate electrodes 230_2 and 230_4 are arranged in the second column.

To begin with, the interference between the floating gate electrodes adjacent to each other in row direction will be set forth. According to the embodiment, the section of the floating gate electrode is configured with the horizontal portion 231 and the vertical portion 233. That is, the floating gate electrode has the inverted T-shaped section. Therefore, the distance $d_3$ between the vertical portions 233_1 and 233_2 of the first and second floating gate electrodes 230_1 and 230_2 is greater than the distance $d_2$ between the horizontal portions 231_1 and 231_2 so that the interference between the adjacent floating gate electrodes may be reduced.

In addition, since the horizontal portion may be formed as thin as possible, a facing area $S_3$ between two horizontal portion 231_1 and 231_2 adjacent to each other in row direction is very small so that the interference can be neglected even though the distance $d_2$ between the horizontal portions 231_1 and 231_2 becomes short. Meanwhile, although the vertical portions 233_1 and 233_2 adjacent to each other in row direction can have large thicknesses $h_2$ for high couple ratio so that a facing area $S_4$ between the vertical portions 233_1 and 233_2 becomes large, the interference does not increase any more because the distance $d_3$ between the vertical portions 233_1 and 233_2 is sufficiently long. As described above, the distance $d_3$ between the two vertical portions 233_1 and 233_2 increases as the width $w_2$ of the vertical portion becomes small, which enables the interference between the vertical portions adjacent to each other in row direction to be reduced.

Herebelow, the interference between the floating gate electrodes adjacent to each other in column direction will be set forth. The interference between the first and third floating gate electrodes 230_1 and 230_3 depends on a total facing area $S_{TOTAL}$ which is a summation of a facing area ($S_1=w_1 \times h_1$) between the horizontal portions and a facing area ($S_2=w_2 \times h_2$) between the vertical portions. Herein, since the vertical portion has a narrow width $w_2$, the interference between the floating gates adjacent to each other in column direction may be reduced.

It is noticed that the shape of the floating gate electrode 230 in FIGS. 9A and 9B be illustrated exemplarily for the sake of illustrative convenience, and thus its shape may be slightly modified according to a variety of fabrication processes. Therefore, it is construed that the shape of the floating gate electrode of the embodiment is not limited to the shape shown in FIGS. 9A and 9B and the aforementioned descriptions, but may be modified within the scope of the allowable change of the fabrication process. For example, even though it is illustrated that the layer or the element has a soft surface, it may have somewhat a rugged surface rather the soft surface. Likewise, even though it is illustrated that the layer or the element has a flat surface, it may have somewhat a soft and rugged surface rather the flat surface. In addition, even though it is illustrated that the layer or the element has a vertical sidewall, it may have somewhat an inclined sidewall. For instance, although it is schematically illustrated in FIGS. 9A and 9B that the surface of the floating gate electrode has a flat surface, i.e., the surface of the horizontal and vertical portions are flat, it may have a soft surface or somewhat a rugged surface. Furthermore, although it is illustrated in FIGS. 9A and 91B that the side surfaces of the floating gate electrode, i.e., the side surfaces of the horizontal and vertical portions, are vertical, it may be formed such that it is slightly inclined. Moreover, the width of the vertical portion may increase more and more as it is spaced apart from the substrate farther and farther. Likewise, the width of the horizontal portion may increase more and more as it is spaced apart from the substrate farther and farther.

One example of various floating gate electrodes will be illustrated with reference to FIG. 10 herebelow. Referring to FIG. 10, the horizontal portion 231' of the floating gate electrode 230' is formed such that its the top surface is inclined. In addition, the vertical portion 233' is formed such that its side surface is inclined also. It seems that the floating gate electrode of FIG. 10 is formed by abrading the floating gate electrode illustrated in FIGS. 9A and 9B, but it still has the inverted T-shape basically. It may be understood that the width $w_1$ of the vertical portion illustrated in FIGS. 9A and 9B is correspondent to the maximum width $w_2'$ of the vertical portion 233' when the side surface of the vertical portion 233' of the floating gate electrode 230' illustrated in FIG. 10 is somewhat inclined so that the width of the vertical portion 233' is varied with the height. Likewise, it may be understood that the width $w_1$ of the horizontal portion illustrated in FIGS. 9A and 91B is correspondent to the maximum width $w_1'$ of the horizontal portion 231' when the top surface of the horizontal portion 231' of the floating gate electrode 230' illustrated in FIG. 10 is inclined so that the width of the horizontal portion 231' is varied with the height.

As described above, the maximum width $w_1'$ of the horizontal portion 231' is larger than the maximum width $w_2'$ of the vertical portion 233', and the cross-sectional area $S_1$ of the horizontal portion 231' is greater than the cross-sectional area $S_2$ of the vertical portion 233'. The maximum width $w_1'$ of the horizontal portion 231' may be 1.5~2.5 times larger than the minimum width $w_3'$ of the vertical portion 233'.

The various modifications in the shapes of the floating gate of the memory transistor illustrated with reference to FIGS. 9A, 91B and 10 may also be equally applied to the first portion of the first gate of the select transistor.

Figure 11:
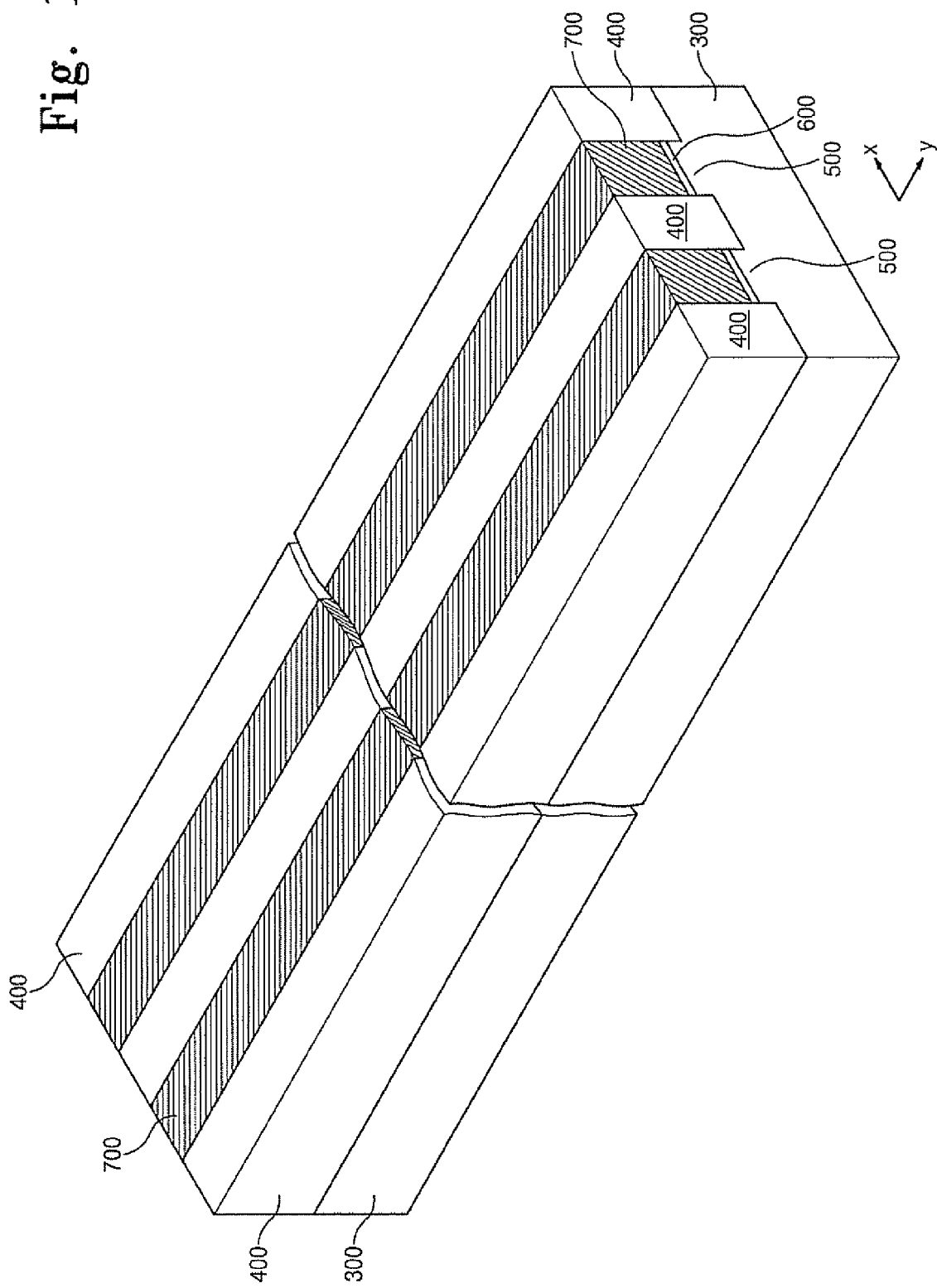
FIGS. 11 to 18 are drawings illustrating a method for forming the NAND flash memory device according to one embodiment of the present invention.

Herebelow, a method for forming a NAND flash memory device according to one embodiment of the present invention will be illustrated with reference to FIGS. 11 to 18. Referring to FIG. 11, a device isolation process is performed to form a device isolation layer pattern 400 on a substrate 300, which is extended in column direction, i.e., y-axis. Therefore, active regions 500 are defined in virtue of the device isolation layer pattern 400. A first insulating layer 600 and a first conductive pattern 700 are formed on the respective active regions 500. The first conductive pattern 700 is self-aligned on the active region 500. In detail, an insulating layer for the first insulating layer 600 and a conductive layer for the first conductive layer pattern 700 are formed on the substrate 300. Subsequently, the conductive layer, the insulating layer, and a portion of the substrate 300 are etched to predetermined thicknesses to define a device isolation region. Thus, the active region 500 is defined in the substrate 300, and the first insulating layer 600 and the first conductive layer pattern 700 are self-aligned on the active region 500. An insulating material is filled into the device isolation region where predetermined portions are removed by etching process, thereby forming the device isolation layer pattern 400. Herein, the method of forming the device isolation layer pattern 400 may be accomplished by performing a planarization process such as chemical mechanical polishing (CMP) or etch-back process after depositing the insulating material.

The first conductive pattern 700, which is used as both the first gate of the select transistor and the floating gate of the memory transistor, for example, may be formed of silicon. The first insulating layer 600, which is used as both the gate insulating layer of the select transistor and the tunneling insulating layer of the memory transistor, may be formed of a silicon oxide layer with a thickness in range of 20 □ to 200 □ but it is not limited to the above so that the first insulating layer 600 may be formed of a metal insulating layer with high dielectric constant.

Figure 12:
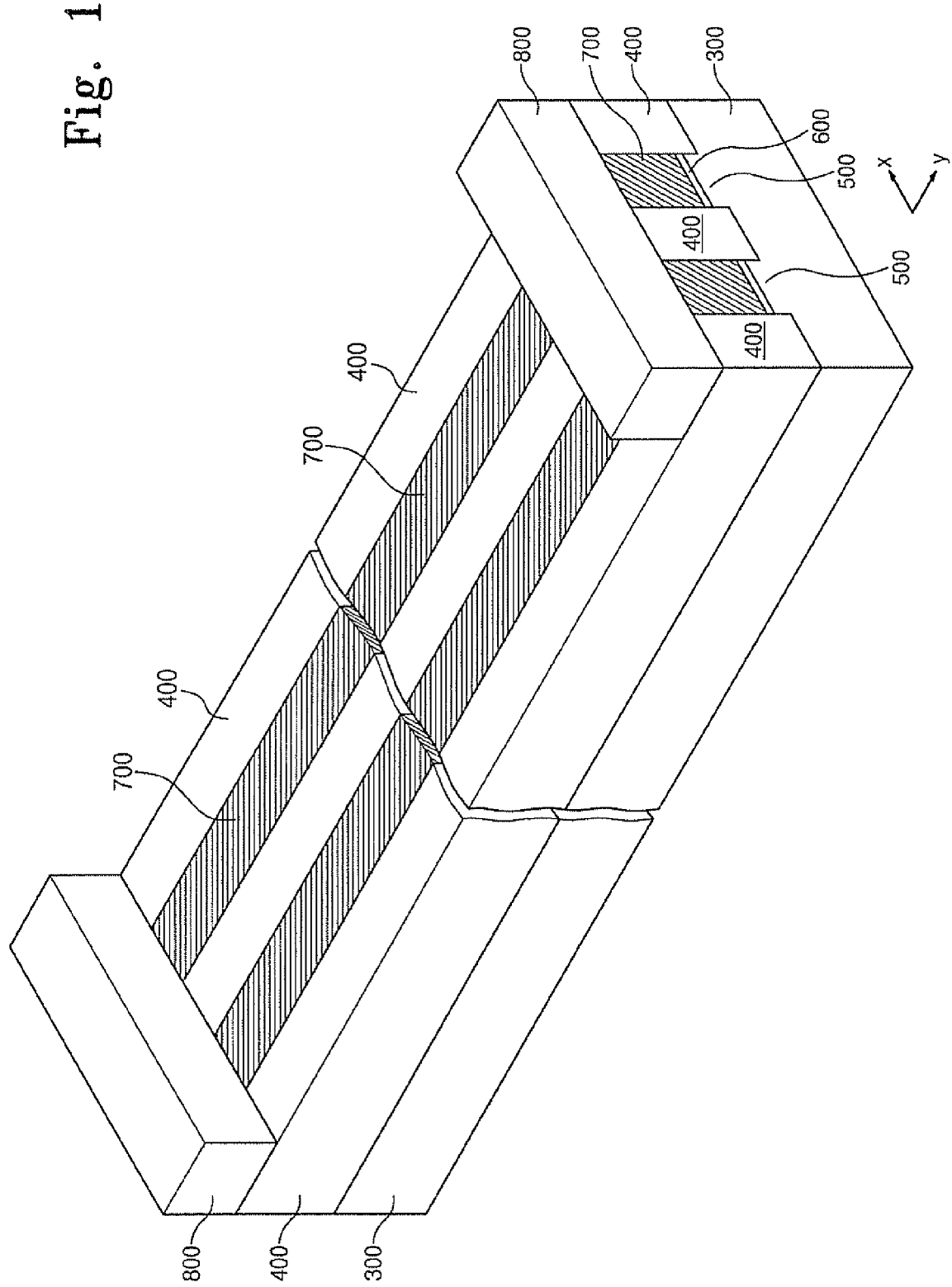

Referring to FIG. 12, a mask 800 is formed on the first conductive layer pattern 700 and the device isolation layer 400 to expose the inverted T-shaped gate region. That is, the mask 800 exposes the first region and a portion of the second region adjacent to the first region at the same time. The mask 800 may be formed of a material having an etch selectivity with respect to the first conductive pattern 700 and the device isolation layer pattern 400. For instance, the mask 800 may be formed of silicon nitride. Herein, the mask 800 exposes the portion of the second region as well as the first region, which enables the first portion of the first gate of the select transistor formed in the second region to have the inverted T-shaped figure.

Figure 13:
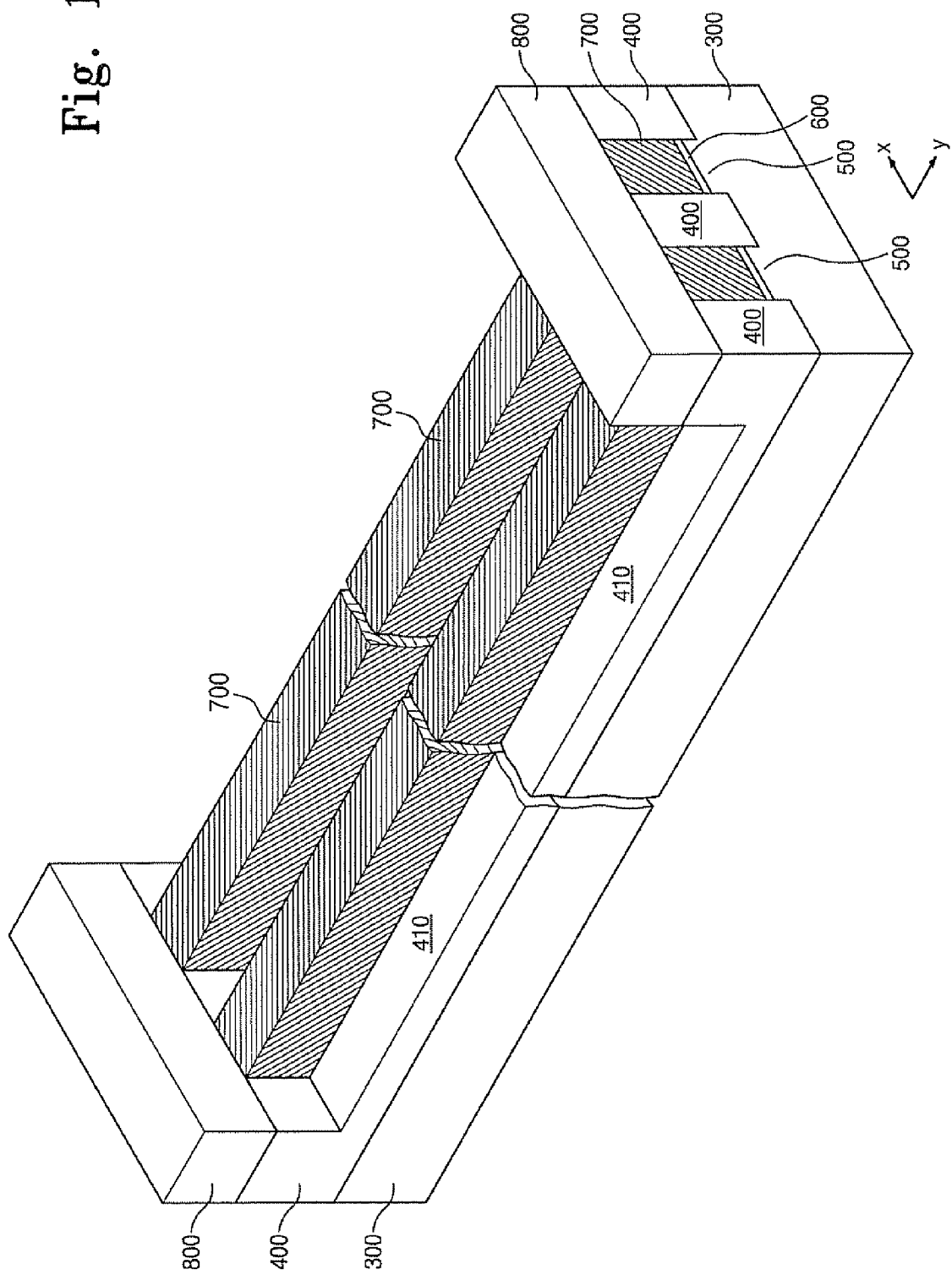

Referring to FIG. 13, the device isolation layer pattern 400, which is not covered with the mask 800 in the inverted T-shaped gate region, is removed partially so as to form a lowered device isolation layer pattern 410 of which the top surface is lower than the first conductive pattern 700. The lowered device isolation layer pattern 410 partially exposes the side surface of the first conductive layer pattern 700.

Figure 14:
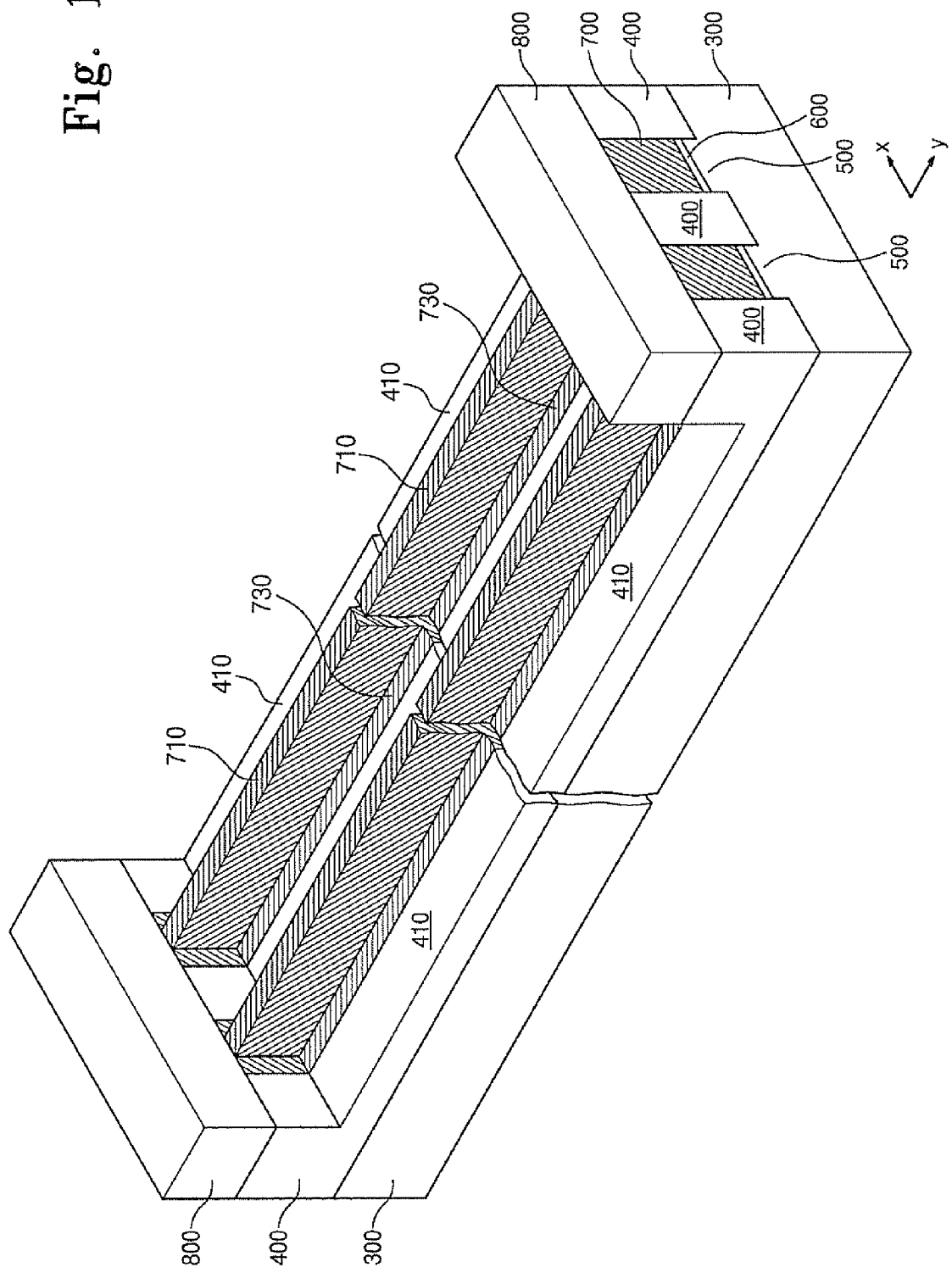

Referring to FIG. 14, the exposed side surface of the first conductive pattern 700 is etched so that the width of the first conductive pattern 700 is reduced. The narrowed first conductive layer pattern 710 having the narrow width, which is upwardly protruded with respect to the top surface of the lowered device isolation layer pattern 410, is used as the vertical portion of the inverted T-shaped gate. Meanwhile, the remaining first conductive pattern 730 encompassed by the lowered device isolation layer pattern 410 which is disposed under the narrowed first conductive layer pattern 710 is used as the horizontal portion of the inverted T-shaped gate. The etching of the exposed side surface of the first conductive layer pattern 700, for example, may be performed by wet etching process using predetermined etching solution. Alternatively, a dry etching process may also be employed using etching gas. In case of using the wet etching process, the etching solution contains $NH_4OH$.

Figure 15:
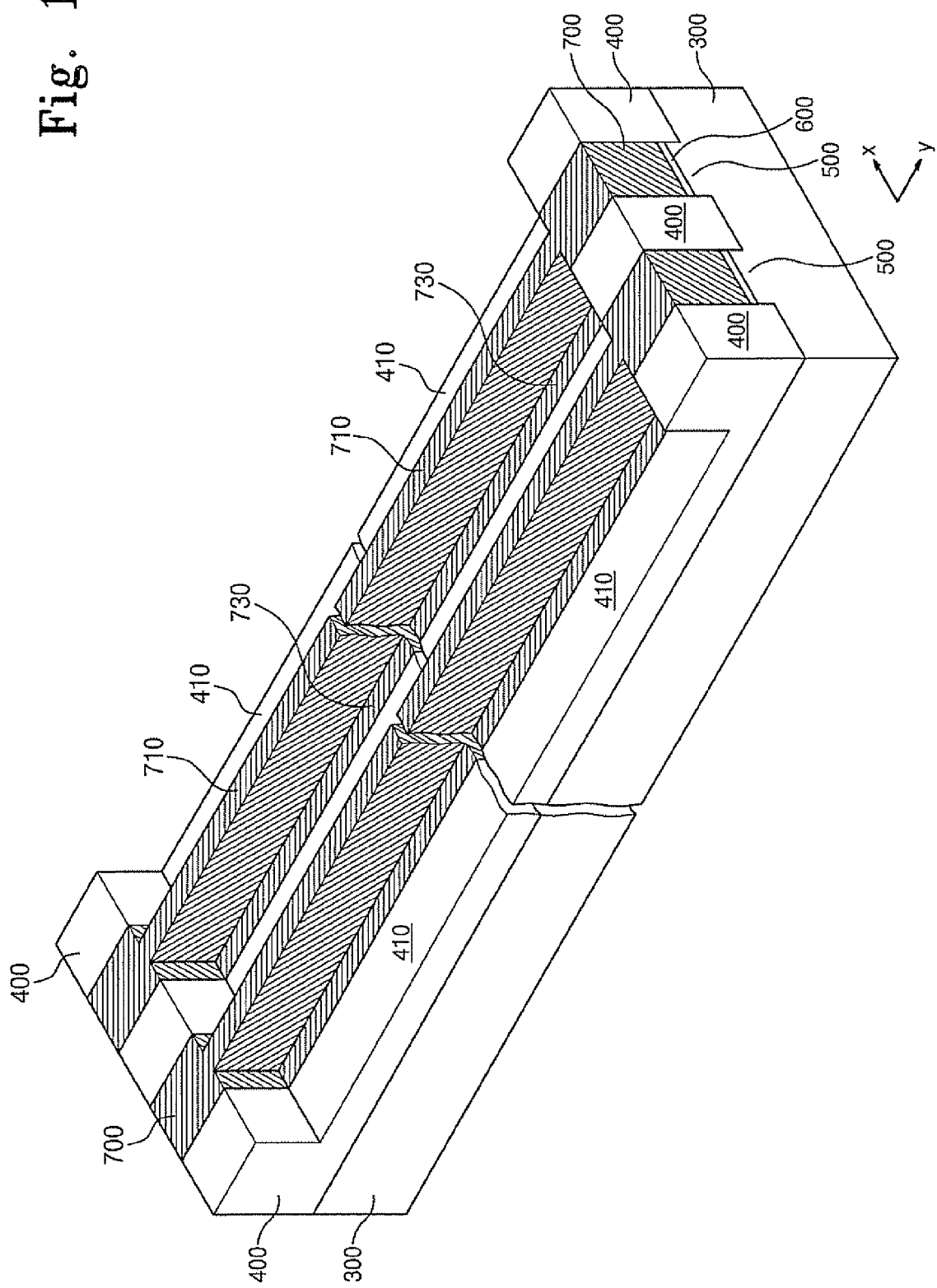

Referring to FIG. 15, the mask 800 is removed so as to expose the device isolation layer pattern 400 and the first conductive layer pattern 700 in the box-shaped gate region of the second region.

Figure 16:
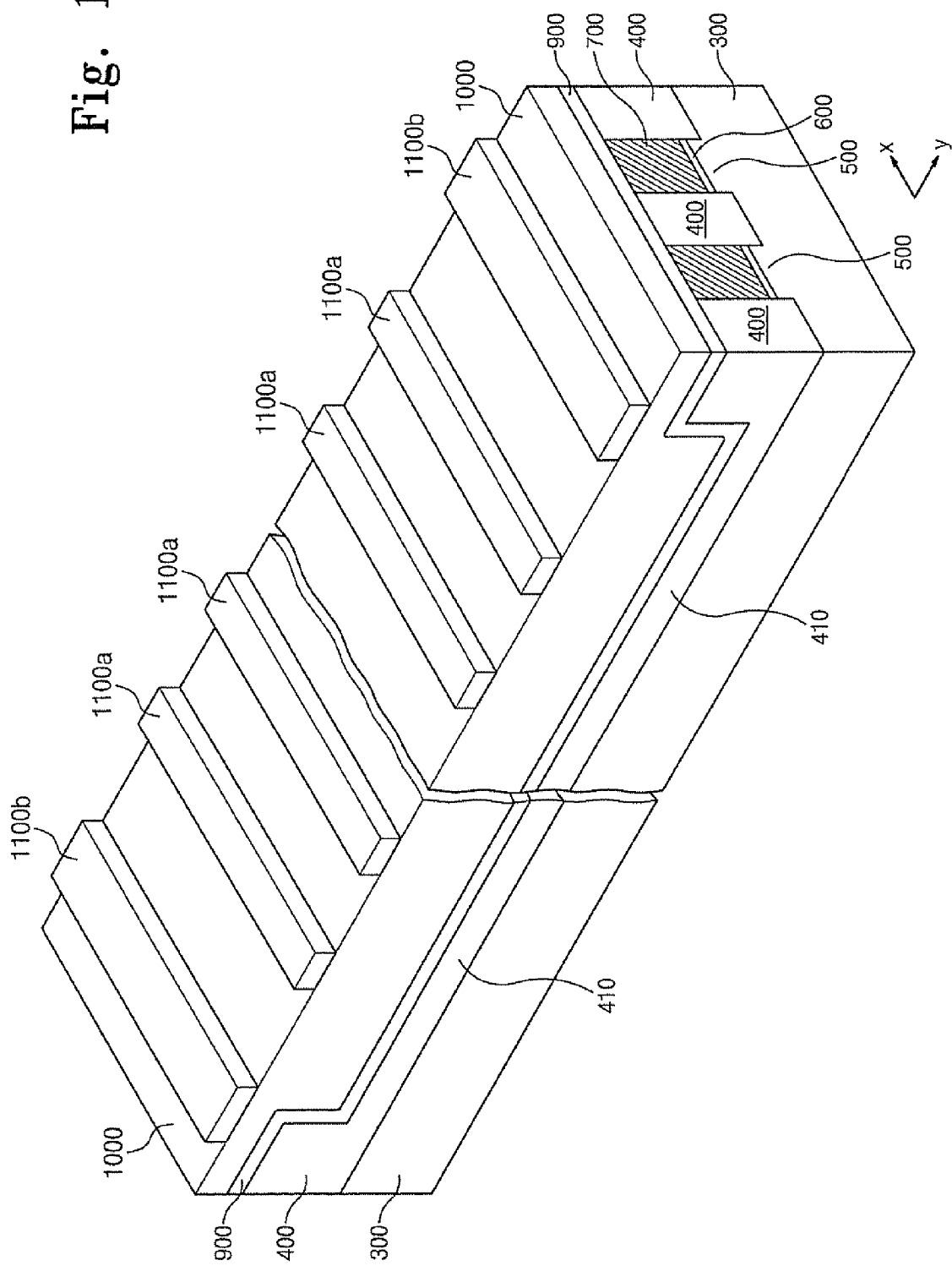
Figure 17:
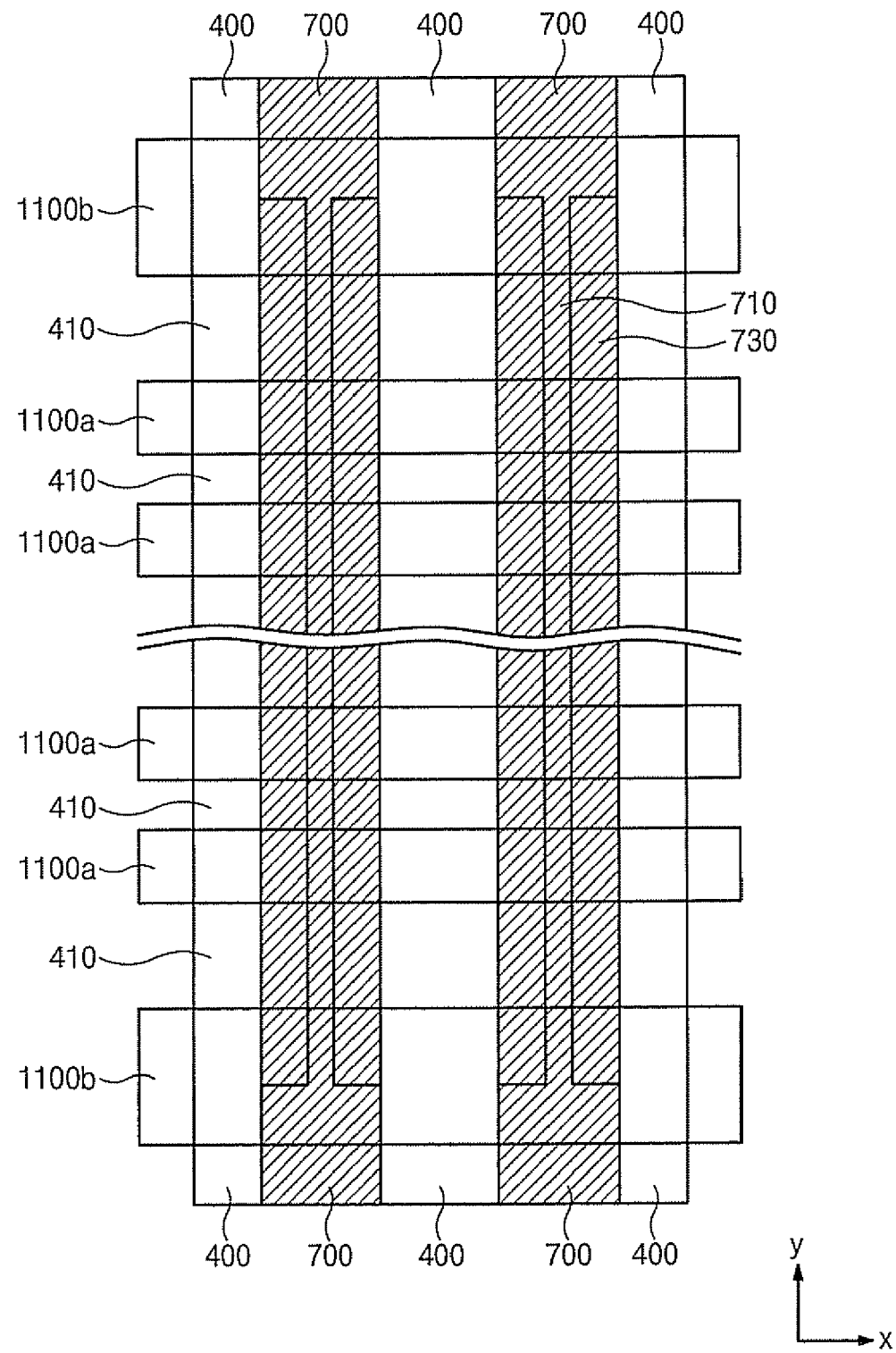

Referring to FIGS. 16 and 17, after forming a second insulating layer 900 and a second conductive layer 1000, gate masks 1100a and 1100b are formed defining the control gates of the memory transistors and the second gates of the select transistors, wherein the gate masks 1100a and 1100b are extended in row direction, i.e., x-axis.

Figure 18:
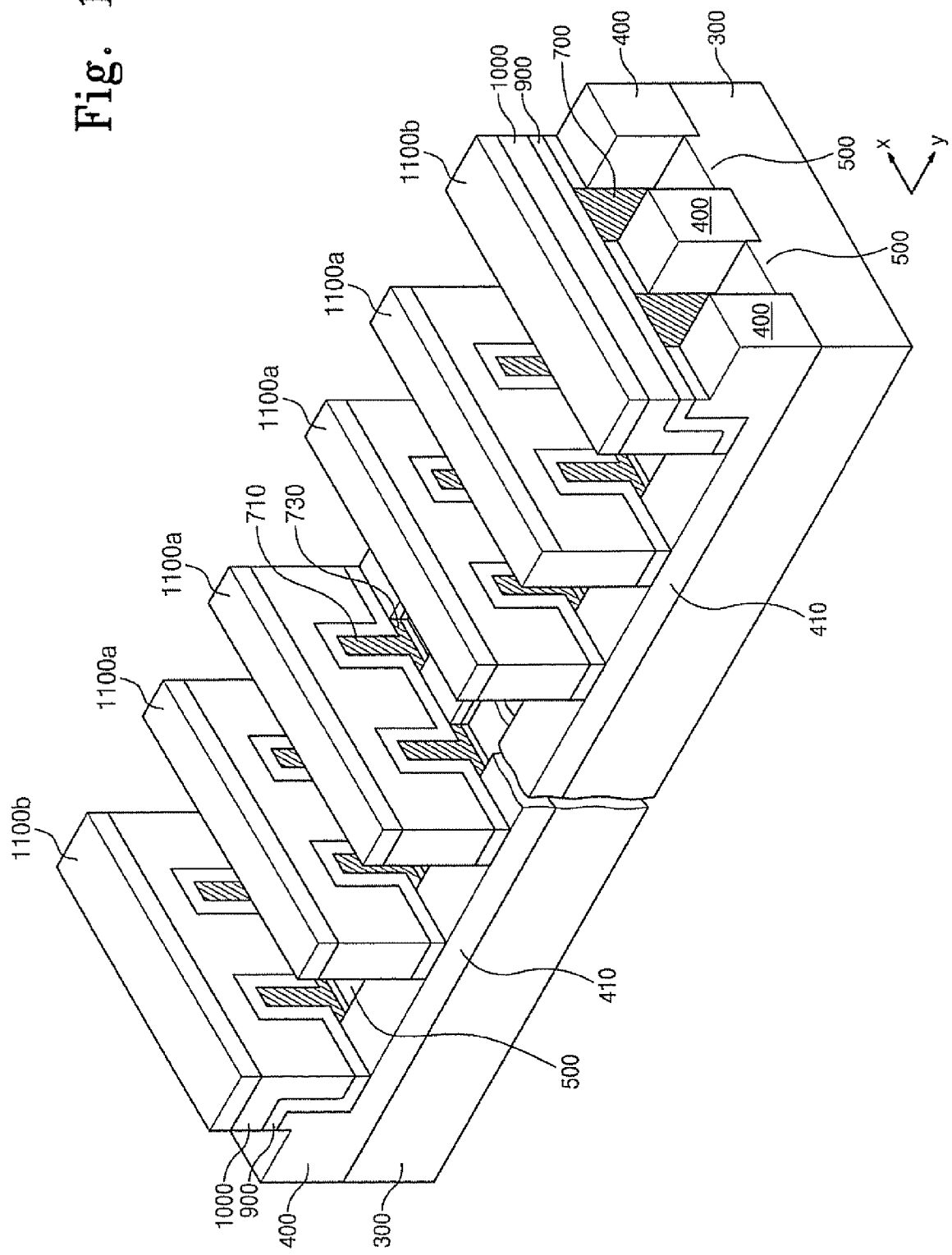

Referring to FIG. 18, the second conductive layer 1000, the second insulating layer 900, and the first conductive layer pattern 700 are etched using the gate masks 1100a and 1100b as etch masks, to thereby form the stack gate structure of the memory transistor and the stack gate structure of the select transistor. The stack gate structure of the memory transistor includes a floating gate formed from the first conductive layer pattern, the gate interlayer insulating layer formed from the second insulating layer, and the control gate formed from the second conductive layer. The stack gate structure of the select transistor includes the first gate formed from the first conductive layer pattern, the gate interlayer insulating layer formed from the second insulating layer, and the second gate formed from the second conductive layer.

According to the embodiment of the present invention, since the device isolation layer 400 of the second region where the select transistor is formed is relatively thicker than the lowered device isolation layer 410 of the first region where the memory transistor is formed, it is possible to prevent the active region from being etch-damaged due to the loading effect in the second region during the etching process of forming the stack gate structure. For example, if the device isolation layer has nearly the same thickness in both the first and second regions, the substrate of the second region may be etch-damaged due to the loading effect during the etching process for forming the stack gate structure. This is because the memory transistors are densely formed in the first region but the select transistors are sparsely formed in the second region so that the etching process is well performed in the second region rather than the first region and thus the substrate of the second region may be etch-damaged after all. However, according to the embodiment of the present invention, since the device isolation layer of the second region is thicker than that of the first region, it is possible to effectively prevent the substrate from being etch-damaged. In other words, according to the present invention, the thick device isolation layer of the second region may act as an etch stop layer.

In the select transistor, the electrical connection between the first and second gates may be performed through the butting contact or the like. For example, after forming the second insulating layer 900, the second insulating layer 900 is patterned such that the first conductive layer is exposed in a predetermined portion of the second region where the memory transistor is formed, or the second conductive layer is formed after removing the second insulating layer from the second region. Accordingly, the first and second gates are electrically connected to each other.

Ion implantation process is performed to form source/drain regions for the memory and select transistors. An additional ion implantation process is selectively performed on the source/drain region of the select transistor adjacent to the drain contact. The additional ion implantation process for the source/drain region may be performed using the ion implantation process for heavily doped source/drain regions of the transistors in a peripheral circuit region.

Herebelow, a memory transistor will be set forth in detail.

Figure 19:
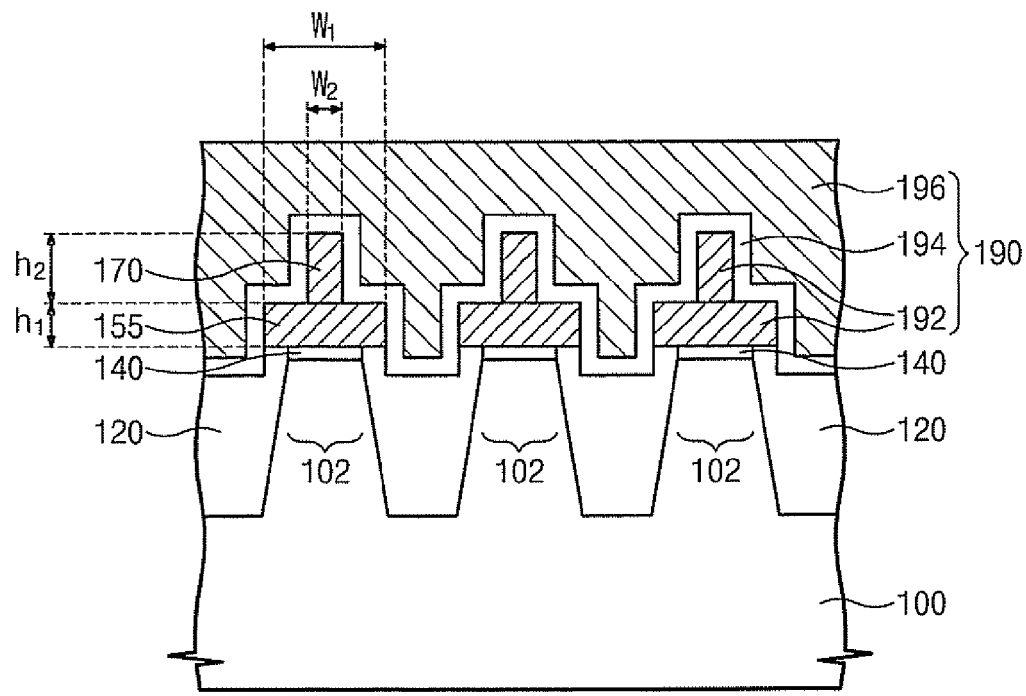
FIG. 19 is a cross-sectional view illustrating a memory transistor of a flash memory device according to another embodiment of the present invention.

FIG. 19 is a cross-sectional view illustrating a memory transistor of a flash memory device according to another embodiment of the present invention. Referring to FIG. 19, a plurality of device isolation layer patterns 120 are disposed on a semiconductor substrate 100 to define an active region 102. That is, the active region 102 is defined between the adjacent device isolation layer patterns 120. A gate insulating layer 140 is formed on the active region 102, and a floating gate electrode 192 is disposed on the gate insulating layer 140. The floating gate electrode 192 includes a lower conductive pattern 155 and an upper conductive pattern 170. The width $w_1$ of the lower conductive pattern 155 is greater than the width $w_2$ of the upper conductive pattern 170. Therefore, the floating gate 102 has an inverted T-shaped section. Over the floating gate electrode 192, a gate interlayer insulating layer 194 and a control gate electrode 196 are disposed. The control gate electrode 196 crosses over the active region 102 and the device isolation layer pattern 120. The control gate electrode 196, the gate interlayer insulating layer pattern 194, and the floating gate electrode 192 constitute a stack gate structure 190 of the memory transistor.

It is preferable that the gate insulating layer 140 is formed of a silicon oxide layer having a thickness in range of 20 Å to 200 Å, but a metal insulating layer with high dielectric constant may be used as the gate insulating layer 140 as well. The lower conductive pattern 155 may be formed of polysilicon, and the upper conductive pattern 170 may be formed of polysilicon, silicide, metallic material or a combination thereof. The gate interlayer insulating layer may be a multilayer configured with a silicon oxide layer having a thickness in range of 30 Å to 80 Å, a silicon nitride layer having a thickness in range of 50 Å to 150 Å, and a silicon oxide layer having a thickness in range of 30 Å to 100 Å. The control gate electrode 196 may be formed of polysilicon, silicide, metallic material or a combination thereof.

According to the present invention, the width $w_1$ of the lower conductive layer pattern 155 is greater than the width of the top surface of the active region 102 or the width of the gate insulating layer 140. In addition, the top surface of the device isolation layer pattern 120 between the adjacent lower conductive patterns 155 may be lower than the top surface of the active region 102. Accordingly, the bottom surface of the gate interlayer insulating layer pattern 194 or the bottom surface of the control gate electrode 196 may also be lower than the top surface of the active region 102 between the adjacent lower conductive patterns 155. If the control gate electrode 196 is lower than the top surface of the active region 102, the facing area between the control gate electrode 196 and the floating gate electrode 192 increases. In addition, the control gate electrode 196 may prevent the interference between the floating gate electrodes adjacent in row direction, e.g., a capacitive coupling between the adjacent gate electrodes.

The increase of the facing area between the control gate electrode and the floating gate electrode enables a coupling ratio (CR) to increase, wherein the coupling ratio represents the efficiency that the voltage applied to the control gate electrode 196 is transferred to the floating gate electrode 192. Besides, according to the embodiment of the present invention, it is possible to increase the facing area between the control gate electrode 196 and the floating gate electrode 192 without the increase of the height of the floating gate electrode 192, e.g., without the increase of the cross-sectional area. As mentioned above, the flash memory device of the embodiment may have the increased facing area by means of the recessed structure of the top surface of the device isolation layer pattern 120.

Furthermore, since the floating gate 192 has substantially the inverted T-shaped section, the facing area between the floating gate electrodes adjacent to each other in column direction decreases. As illustrated in the drawings, supposing that the width and thickness of the lower conductive pattern 155 be denoted as $w_1$ and $h_1$, respectively, and the width and thickness of the upper conductive pattern 170 be denoted as $w_2$ and $h_2$, respectively, the reduced cross-sectional area of the inverted T-shaped floating gate electrode 192 of the present invention becomes $(w_1-w_2) \times h_2$ in comparison of the box-shaped gate electrode. The reduction of the section area of the floating gate makes the interference effect between the floating gate electrodes adjacent to each other in column direction reduced, which results in providing a process margin capable of increasing the surface area of the floating gate electrode and thus increasing the coupling ratio. The floating gate electrode according to the embodiment of the present invention makes it possible to increase the surface area while maintaining the maximum cross-sectional area demanded for suppressing the interference effect, wherein the surface area determines the coupling ratio.

According to the embodiment of the present invention, the cross-sectional area $(w_1 \times h_1)$ of the lower conductive pattern 155 is at least twice larger than the cross-sectional area $(w_2 \times h_2)$ of the upper conductive pattern 170. It is preferable that the width $w_1$ of the lower conductive pattern 155 is greater than the width $w_2$ of the upper conductive pattern 170. A gate structure of a nonvolatile memory device according to other embodiments of the present invention will be more fully illustrated with regard to fabrication methods below.

Figure 20:
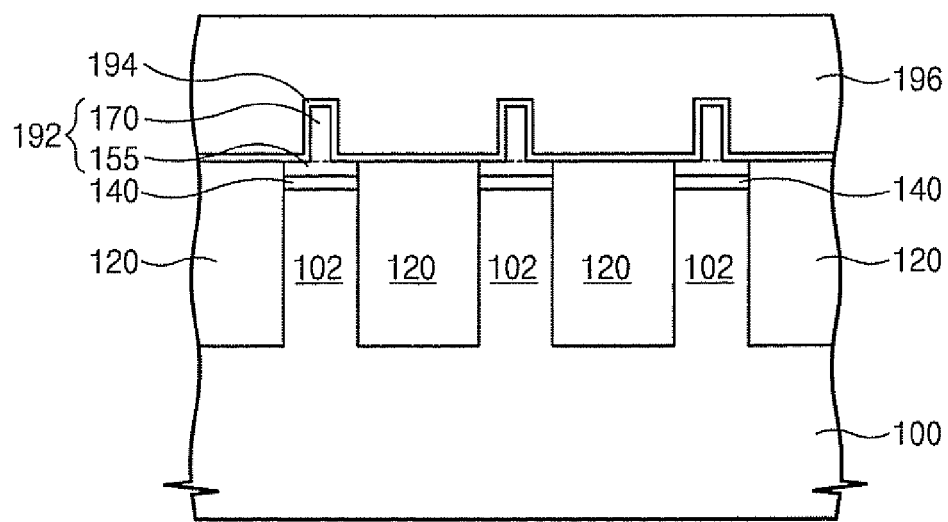
FIG. 20 is a cross-sectional view of a flash memory device according to another embodiment of the present invention.

FIG. 20 is a cross-sectional view of a flash memory device according to another embodiment of the present invention. The floating gate electrode 192 includes a lower conductive pattern 155 and an upper conductive pattern 170, as similar to the floating gate electrode of FIG. 19, wherein the width of the upper conductive pattern 170 is less than the width of the lower conductive pattern 155. For instance, the floating gate electrode 192 has a stepped side surface. In the nonvolatile memory device of the embodiment, the floating gate 192 is self-aligned on the active region 102. For example, the lower conductive pattern 155 of the floating gate electrode 192 is substantially equal in width to the top surface of the active region 102. For instance, when sequentially patterning two layers deposited during semiconductor fabrication process by using one etch mask, two patterns formed from the two layers may have the same width substantially. In addition, the top surface of the device isolation layer pattern 120 is equal in height to the top surface of the lower conductive pattern 155 of the floating gate electrode 192. Further, the floating gate electrode 192 is formed such that the upper conductive pattern 170 is greater in cross-sectional area than the lower conductive pattern 155 in the embodiment of the present invention.

Figure 21:
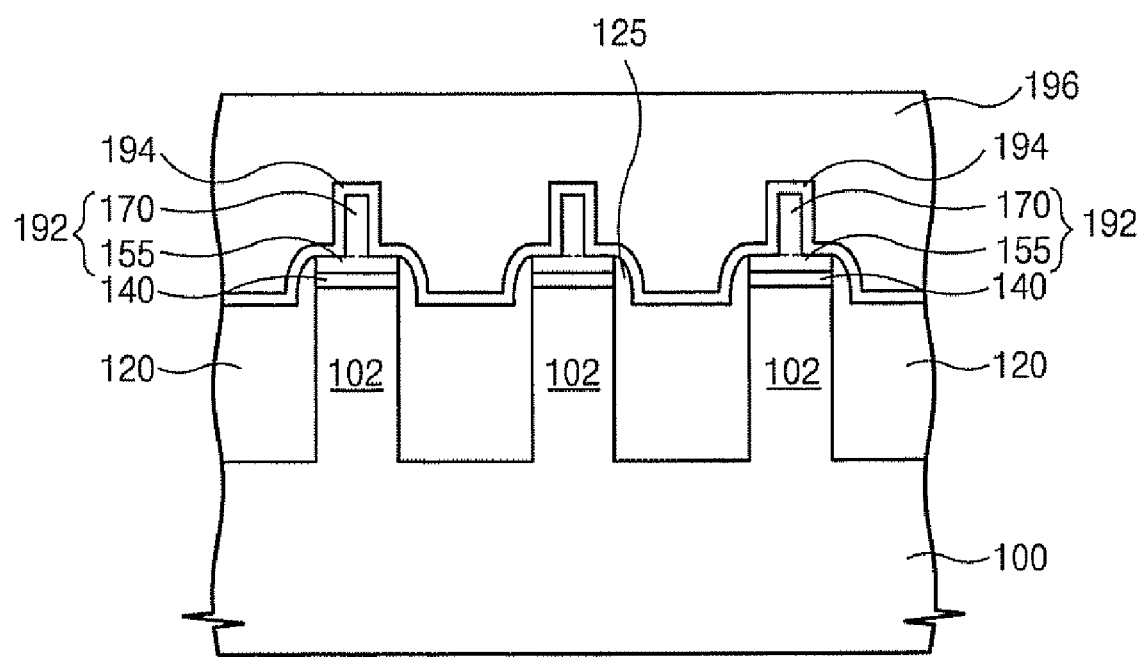
FIG. 21 is a cross-sectional view of a flash memory device according to another embodiment of the present invention.

FIG. 21 is a cross-sectional view of a flash memory device according to another embodiment of the present invention. In the flash memory device of the embodiment, the device isolation layer pattern 125 in shape of a spacer is formed on the side surface of both the lower conductive pattern 155 and the gate insulating layer 140, which is different from the flash memory device illustrated in FIG. 20. Herein, the top surface of the device isolation layer pattern 120 is relatively lower than the top surface of the active region 102.

Figure 22A:
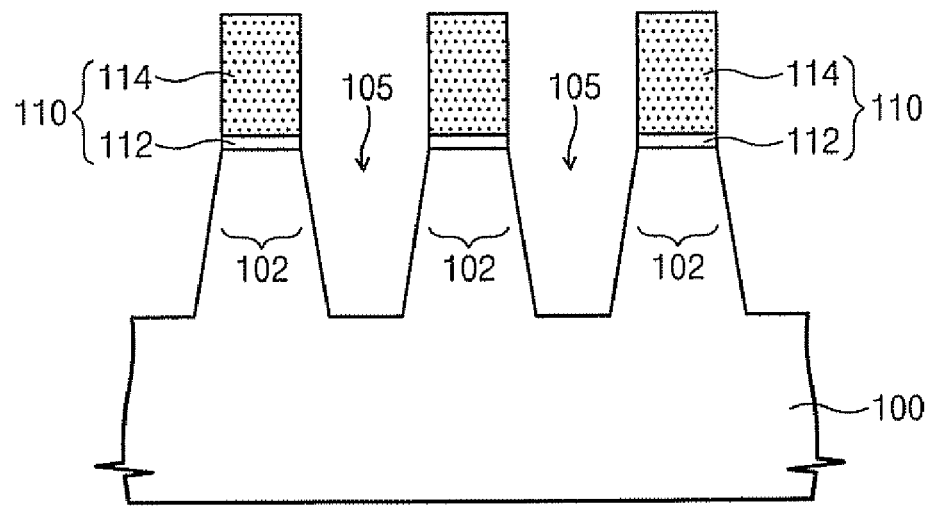
FIGS. 22A to 22H are cross-sectional views illustrating a method for fabricating a NAND flash memory device according to one embodiment of the present invention.

FIGS. 22A to 22H are cross-sectional views illustrating a method for fabricating a NAND flash memory according to one embodiment of the present invention. Referring to FIG. 22A, a trench mask pattern 110 is formed on a semiconductor substrate 100. The trench mask pattern 110 includes a pad oxide layer pattern 112 and a mask nitride layer pattern 114 stacked in sequence. The semiconductor substrate 100 is etched using the trench mask pattern 110 as an etch mask, to thereby form a trench 105 defining the active regions 102.

The trench mask pattern 110 may further include a silicon oxide layer, e.g., a middle temperature oxide (MTO), stacked on the mask nitride pattern 114, and an anti-reflection layer. Additionally, the kind, the thickness, and the stacking sequence of the layers constituting the trench mask pattern 110 may be variously changed. The forming process of the trench 105 may include a process of anisotropically etching the semiconductor substrate 100 using etching recipe having an etch selectivity with respect to the trench mask pattern 110. Although it is illustrated in the drawings that the sidewall of the trench 105 is inclined, the sidewall of the trench 105 has a vertical profile according to processes. Moreover, a joint portion of the sidewall and bottom of the trench 105 may have a smooth curve.

Figure 22B:
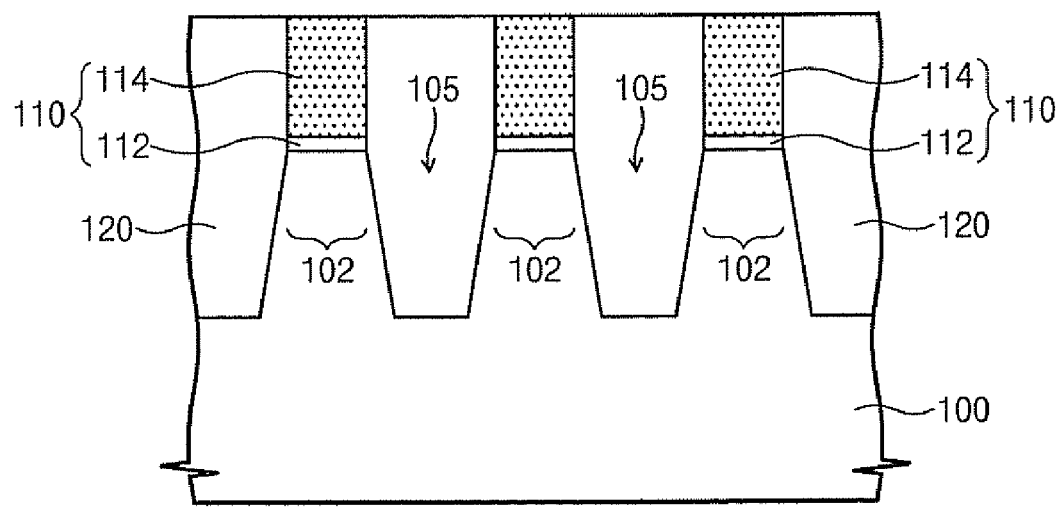

Referring to FIG. 22B, after forming an insulating layer for device isolation to fill the trench 105, the insulating material for device isolation is etched till the top surface of the trench mask pattern 110 is exposed, thereby forming the device isolation layer pattern 120, which fills the trench 105 and encompasses the trench mask pattern 110.

According to the embodiment of the present invention, it is preferable that the insulating material for device isolation is formed of silicon oxide layer, but it may also be formed of polysilicon, epitaxial silicon, porous insulating layer, etc. In addition, before forming the insulating material for device isolation, a thermal oxide layer (not shown) may be formed on inside walls of the trench 105 for addressing the etch damage produced while etching the semiconductor substrate 100. Furthermore, a liner layer may be additionally formed for preventing the penetration of the impurity. The liner layer may be a silicon nitride layer.

It is preferable that the etching of the insulating material for device isolation is performed by CMP process using a slurry having an etch selectivity with respect to the trench mask pattern 110. Alternatively, dry or wet etch-back process may be used.

Figure 22C:
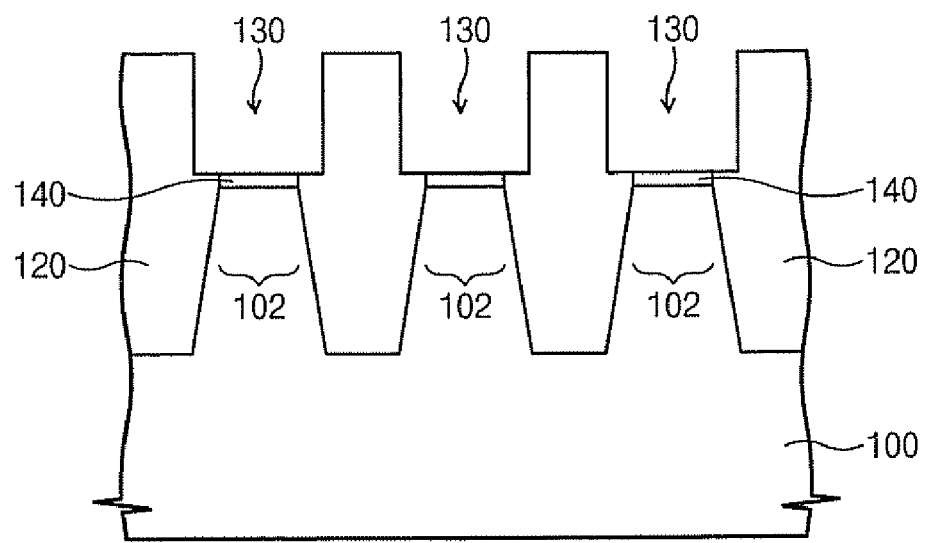

Referring to FIG. 22C, the trench mask pattern 110 is removed to form a gap region 130 exposing the top surface of the active region 102. In detail, the forming of the gap region 130 includes: removing the mask nitride pattern 114 using wet etching recipe having an etch selectivity with respect to the device isolation layer pattern 120; and removing the pad oxide layer pattern 112 using wet etching recipe having an etching selectivity with respect to the semiconductor substrate 100.

Meanwhile, the exposed sidewall of the device isolation layer pattern 120 may be etched to a predetermined thickness while removing the pad oxide layer pattern 112. Accordingly, the width of the gap region 130 becomes greater than the width of the active region 102. According to the embodiment of the present invention, since the device isolation layer pattern 120 and the pad oxide layer pattern 112 are formed of the same material, i.e., silicon oxide layer, it is possible to enlarge the width of the gate region 130 without a supplementary process. In addition, as the width of the gap region 130 is enlarged, the floating gate electrode of the nonvolatile memory has the enlarged width also, and further, it is possible to prevent a gate insulating layer from being damaged during a following process for recessing the top surface of the device isolation layer pattern 120. This will be illustrated later with reference to FIG. 20G.

A gate insulating layer 140 is formed on the top surface of the exposed active region 102. It is preferable that the gate insulating layer 140 is formed of silicon oxide through thermal oxidation process, but a metal insulating layer with high dielectric constant may be used also. The thickness of the gate insulating layer 140 may be in range of 20 Å to 200 Å.

Figure 22D:
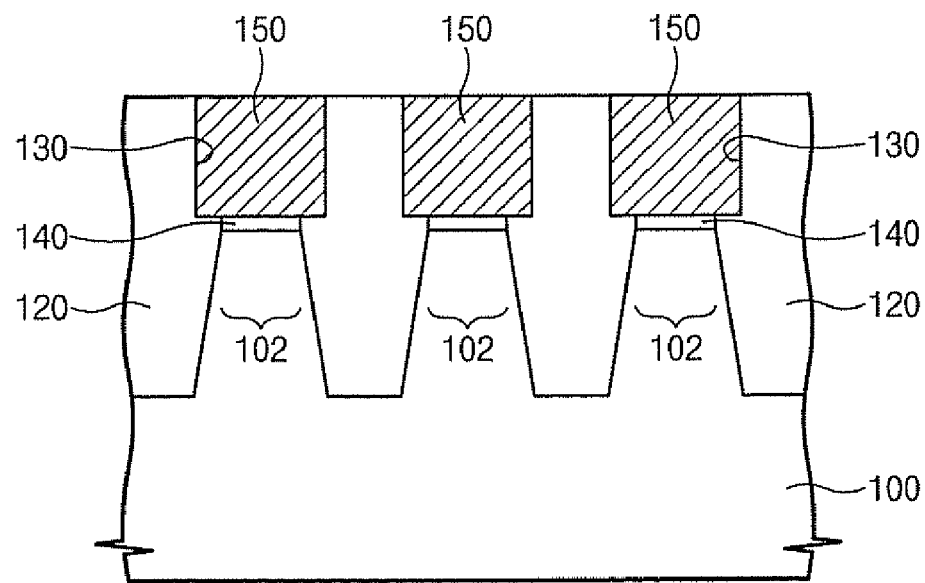

Referring to FIG. 22D, after forming a conductive material for the lower conductive pattern of the floating gate into the enlarged gap region 130, the conductive material is etched till the top surface of the device isolation layer pattern 120 is exposed. As a result, conductive gap-fill patterns 150 are formed on the active region 102 to fill the gap region 130. At this time, as the width of the gap region 130 has been enlarged already, the width of the conductive gap-fill pattern 150 is also greater than the width of the active region 102. Although it is more clearly understood from illustrations below, the width of the conductive gap-fill pattern 150 determines the width of the floating gate electrode. Therefore, it is possible to form the floating gate electrode such that its width is greater than the width of the active region.

It is preferable that the conductive gap-fill pattern 150 filling the gap region 130 is formed of polysilicon through CMP process. The forming of the conductive gap-fill pattern 150 includes planarizing the top surface of the conductive gap-fill pattern 150 using wet etching recipe having an etch selectivity with respect to the device isolation layer pattern 120. For example, this planarization process may be performed using CMP process. At this time, it is preferable to use a predetermined material as a slurry in the CMP process, wherein the predetermined material has an etching characteristic, i.e., an etch selectivity, having higher etching rate for polysilicon with respect to the etching rate for silicon oxide.

Figure 22E:
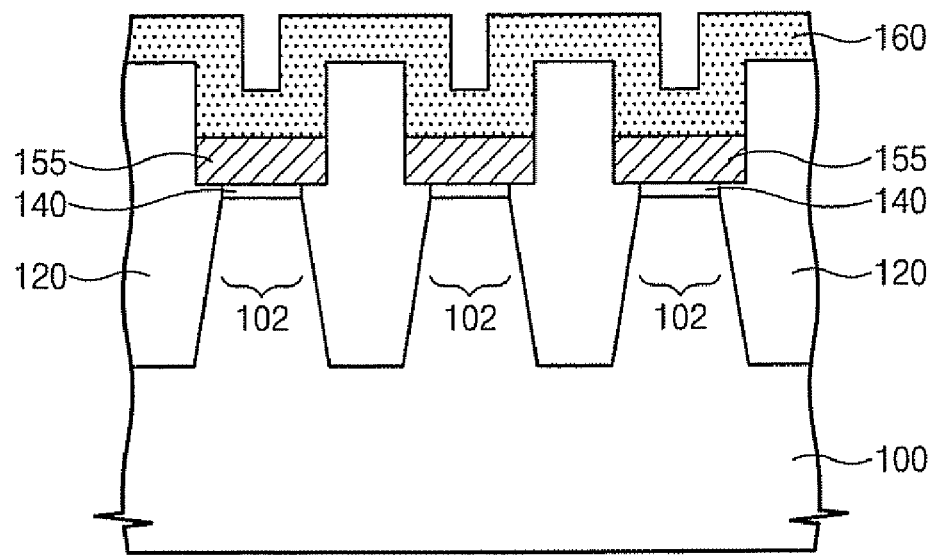

Referring to FIG. 22E, the conductive gap-fill pattern 150 is etched in the inverted T-shaped gate region using the etching recipe having an etch selectivity with respect to the device isolation layer pattern 120, to thereby form a lower conductive pattern 155 remaining under the gate region 130. At this time, the depth of the conductive gap-fill pattern 150 which will be etched is less than the depth of the gap region 130. Accordingly, the lower conductive pattern 155 remains intact under the gap region 130, and the sidewall of the device isolation layer pattern 120 is partially exposed. Resultingly, the thickness of the lower conductive pattern 155 (see $h_1$ of FIG. 19) is less than the depth of the gap region 130.

Afterwards, a mold layer 160 is conformally formed on the lower conductive pattern 155. The mold layer 160 is formed of a material having an etch selectivity with respect to the lower conductive pattern 155. For example, the mold layer 160 is formed of silicon nitride layer, silicon oxide layer, silicon oxide layer, or metal nitride layer. Although it will be more fully described later, it is preferable to precisely control the thickness of the mold layer 160 because it is a process parameter determining the shape of the floating gate according to the present invention. To this end, the mold layer 160 may be formed using low pressure CVD (LPCVD) or atomic layer deposition (ALD) process. In addition, it is also desirable to accurately control the etching depth of the conductive gap-fill pattern 150 and the height of the exposed sidewall of the gap region 130, because they are also process parameters having an effect on the shape of the floating gate.

Figure 22F:
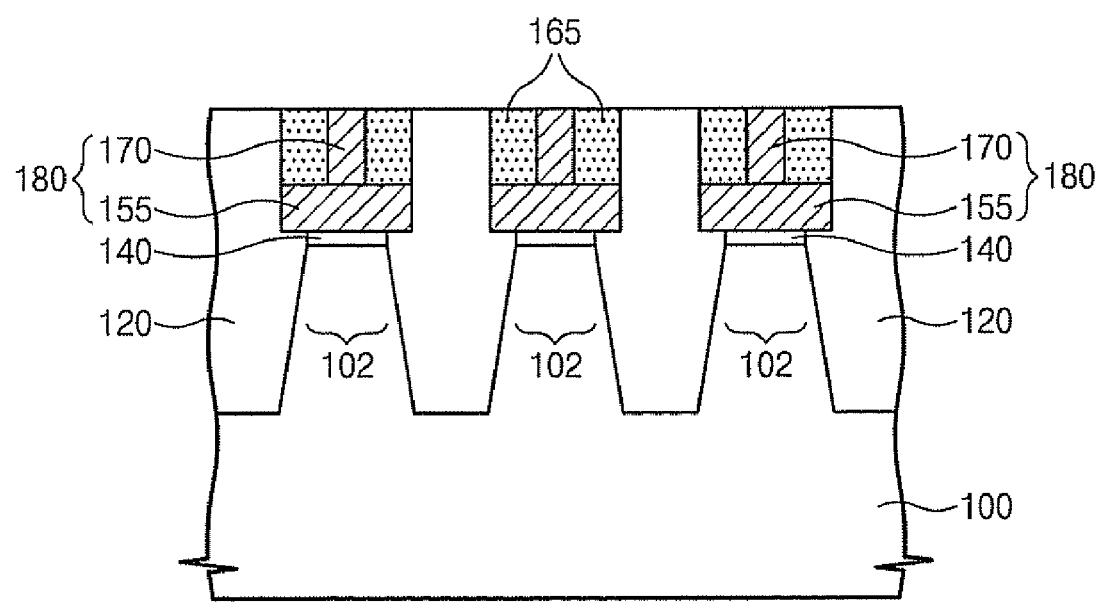

Referring to FIG. 22F, the mold layer 160 is anisotropically etched till the top surface of lower conductive pattern 155 is exposed. Accordingly, a mold spacer 165 is formed, which covers edges of the top surface of the lower conductive pattern 155. Thereafter, after forming an upper conductive layer on the entire surface of the resultant structure in which the mold spacer 165 is formed, the upper conductive layer is etched till the top surface of the device isolation layer pattern 120. As a result, there is formed an upper conductive pattern 170 contacting with the lower conductive pattern 155 between the mold spacers 165. Herein, one pair of the lower and upper conductive patterns 155 and 170 which are in contact with each other constitute a floating gate pattern 180 according to the present invention.

The floating gate pattern 180 has the inverted T-shaped section, as illustrated in FIG. 22F. The cross-sectional shape of the floating gate pattern 180 is determined by the height and width of the lower conductive pattern 155 and the height and width of the lower conductive pattern 170. Therefore, as described above, it is desirable to precisely control following conditions; 1) the height difference between the device isolation layer pattern 120 and the top surface of the active region; 2) the width of the gap region 130; 3) the stack thickness of the mold layer 160; and the etching depth of the upper conductive layer.

As aforementioned, the upper conductive pattern 170 is self-aligned in a central portion of the lower conductive pattern 155 because the upper conductive pattern 170 is formed using the mold spacer 165 as a mold. In addition, according to the present invention, the lower conductive pattern 155 has the thickness enough to prevent the active region 102 from begin exposed during an etching process for separating the floating gate electrode and the control gate electrode. For instance, it is preferable that the thickness of the lower conductive pattern 155 is greater than at least the width of the upper conductive pattern 170.

Meanwhile, the upper conductive layer for the upper conductive pattern 170 may be formed of polysilicon, silicide, metal layer, or a combination thereof, using CVD process or epitaxial growth process. Further, the etching of the upper conductive layer may be performed using CMP process, in which the slurry may have an etch selectivity with respect to the device isolation layer pattern 120 or the mold spacer 165.

Figure 22G:
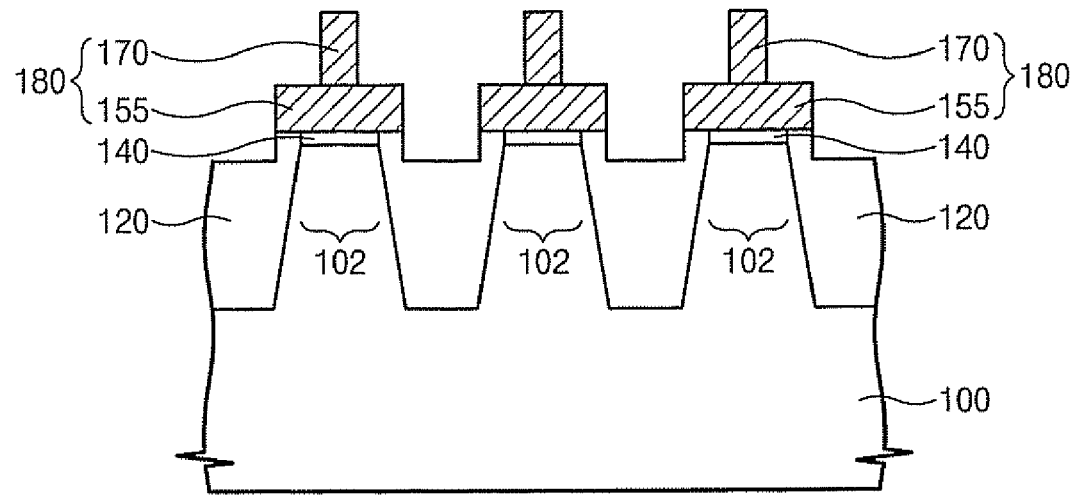

Referring to FIG. 22G, the exposed top surface of the device isolation layer pattern 120 is etched using the upper and lower conductive patterns 170 and 155 as an etch mask. According to the embodiment of the present invention, the top surface of the device isolation layer pattern 120 is etched through this etching process so that the top surface becomes lower than the top surface of the active region 102 between the adjacent lower conductive patterns 155, as illustrated in FIG. 22G.

According to the embodiment of the present invention, the mold spacer 165 may be removed while recessing the device isolation layer pattern 120. Thus, as illustrated in FIG. 22G, the top surface of the lower conductive pattern 155 is exposed except the region contacting with the upper conductive pattern 170. Alternatively, the mold spacer 165 may be removed through an additional process.

Meanwhile, since the lower conductive pattern 155 is wider than the underlying active region 102, it is possible to prevent the active region 102 and the gate insulating layer 140 from being etch-damaged during the recessing of the device isolation layer pattern 120. If considering that the recessing of the device isolation layer pattern 120 is performed till the top surface of the device isolation layer pattern 120 becomes lower than the top surface of the active region 102, this prevention effect is obvious. As described above, it is necessary to enlarge the width of the gap region 130 in order to prevent the etch damage.

Figure 22H:
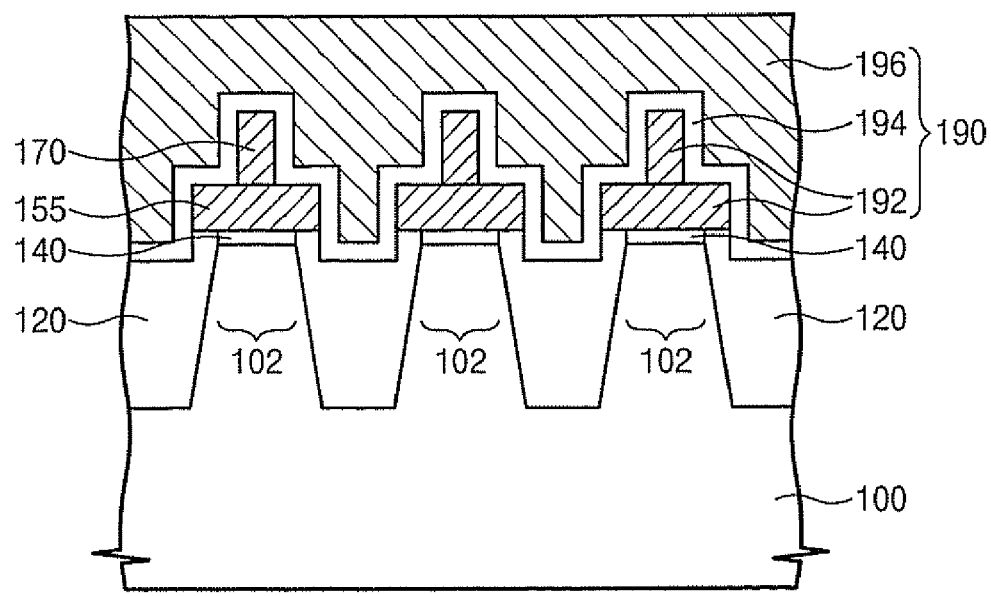

Referring to FIG. 22H, a stack gate structure 190 is formed over the resultant structure in which the top surface of the device isolation layer pattern 120 is recessed. The stack gate structure 190 is configured with a floating gate electrode 192, a gate interlayer insulating layer 194, and a control gate electrode 196 which are stacked in sequence.

The forming of the stack gate structure 190 includes: sequentially forming a gate interlayer insulating layer and a control gate conductive layer over the entire surface of the resultant structure in which the top surface of the device isolation layer pattern 120 is recessed; and pattering the control gate conductive layer, the gate interlayer insulating layer and the floating gate pattern 180. As a result, the control gate electrode 196 is formed such that it crosses over the adjacent active region and the device isolation layer pattern 120, and the floating gate electrodes 192 are electrically insulated from each other along an extension direction of the active region 102. The gate interlayer insulating layer pattern 194 may be a multilayer pattern configured with a silicon oxide layer pattern having a thickness in range of 30 Angstroms to 80 Angstroms, a silicon nitride layer pattern having a thickness in range of 50 Angstroms to 150 Angstroms, and a silicon oxide layer pattern having a thickness in range of 30 Angstroms to 100 Angstroms.

Figure 23A:
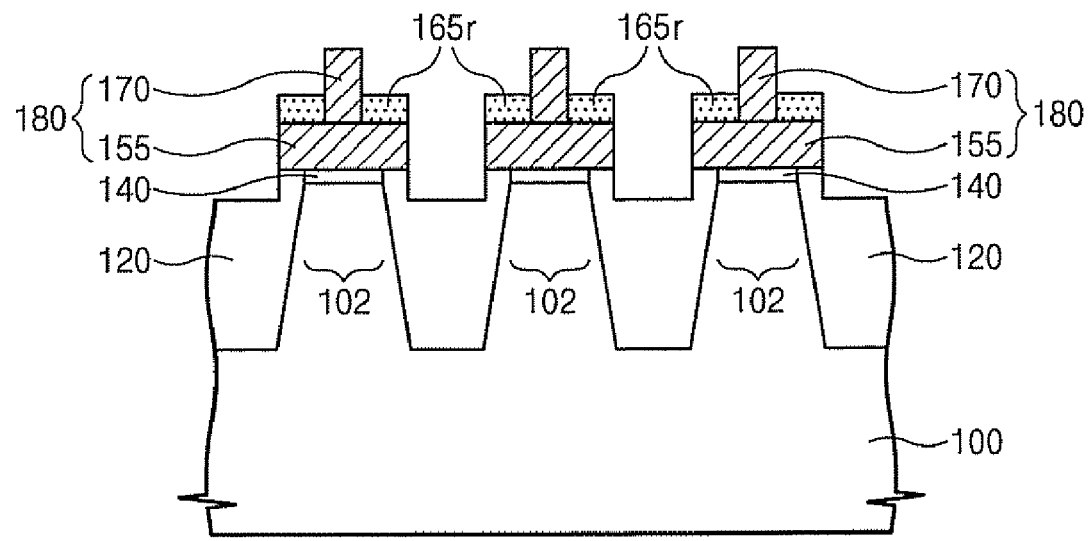
FIGS. 23A and 23B are cross-sectional views illustrating a method for fabricating a NAND flash memory device according to another embodiment of the present invention.
Figure 23B:
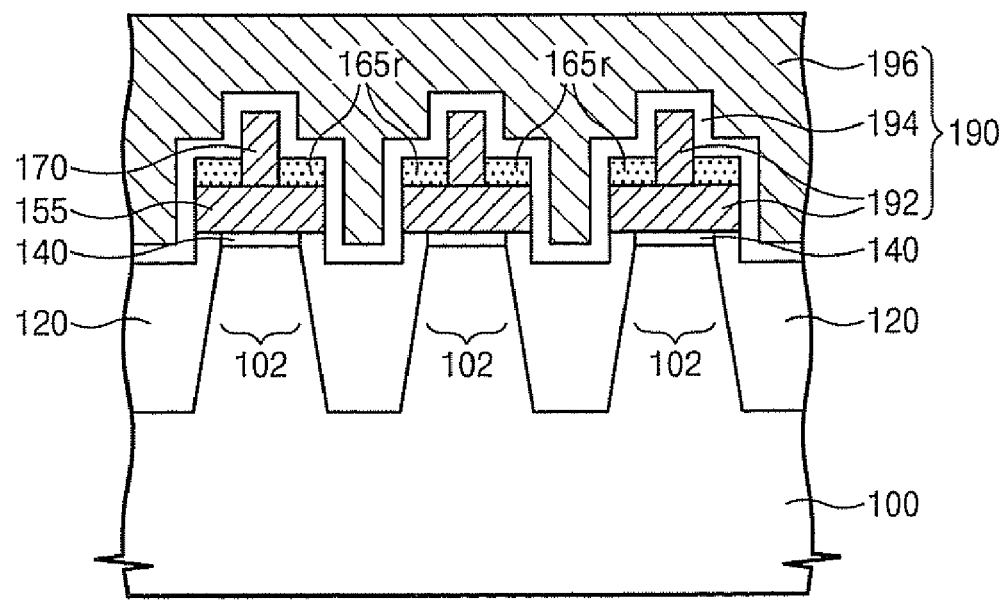

In the above embodiment, a portion 165r of the mold spacer 165 may be removed, which will be set forth in detail with reference to FIGS. 23A and 23B. In virtue of remaining mold spacer 165r, the lower conductive pattern 155 is scarcely etch-damaged during the etching process for forming the stack gate structure. After performing the processes as illustrated in FIGS. 22A to 22F, the exposed top surface of the device isolation layer pattern 120 is etched using the upper and lower conductive patterns 170 and 155 as etch masks. Subsequently, a portion of the mold spacer 165 is removed, thereby forming the remaining mold spacer 165r on the lower conductive pattern 155. Referring to FIG. 23B, after forming a gate interlayer insulating layer and a conductive layer for a control gate electrode, the conductive layer for the control gate electrode, the gate interlayer insulating layer, and the floating gate pattern 180 are patterned so as to form a word line 190. At this time, the remaining mold spacer plays a role in preventing the lower conductive pattern 155 from being etch-damaged.

According to the embodiment of the present invention, the floating gate electrode 192 is configured with the lower conductive pattern 155 and the upper conductive pattern 170 which are formed separately. However, the upper and lower conductive patterns 170 and 15 may be formed from the same conductive layer or the layer of the same texture, as illustrated in FIGS. 24A and 24B.

Figure 24A:
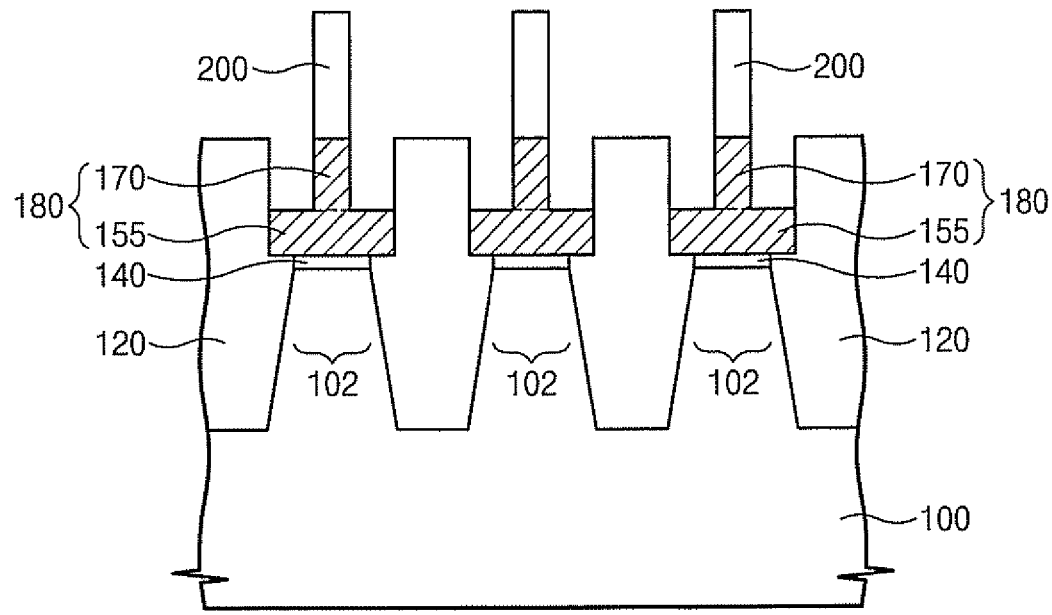
FIGS. 24A and 24B are cross-sectional views illustrating a method for fabricating a NAND flash memory device according to another embodiment of the present invention.
Figure 24B:
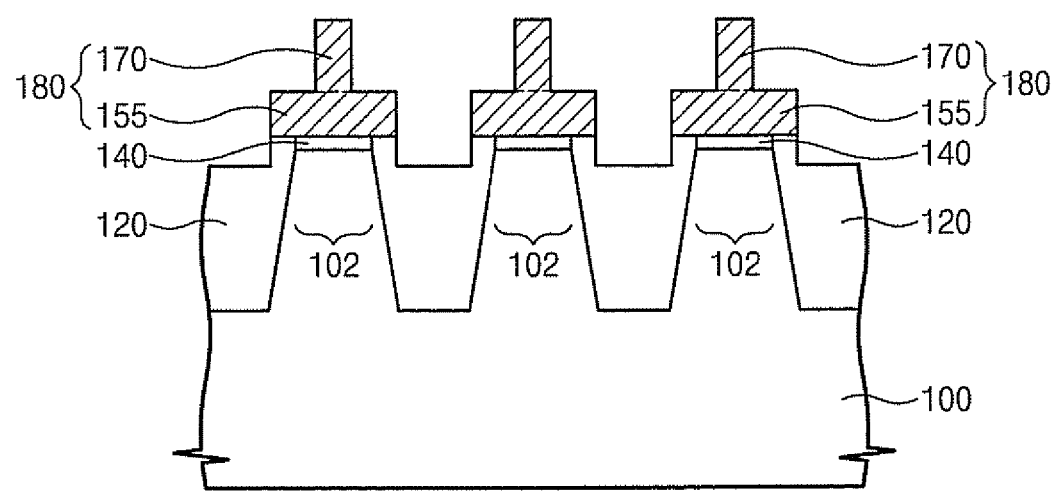

The embodiment of FIGS. 24A and 24B includes a process of forming a mask pattern 200 on the conductive gap-fill pattern (see reference numeral 150 of FIG. 22D) illustrated in the previous embodiment of FIGS. 22A to 22D without a supplementary process for forming the upper conductive layer, wherein the mask pattern defines the upper conductive pattern 170. This mask pattern 200 may be formed on the inverted T-shaped gate region. After performing the processes of FIGS. 22A to 22D, the mask pattern 200 is formed on the conductive gap fill pattern 150. As illustrated in FIG. 24A, the conductive gap-fill pattern 150 is etched to a predetermined depth using the mask pattern 200 as an etch mask, thereby forming the lower conductive pattern 155 and the upper conductive pattern 170. The upper and lower conductive patterns 170 and 155 in the embodiment has the same structure as the other previous embodiments except that they are formed from a single layer.

It is preferable that the mask pattern 200 is a photoresist pattern formed by photolithography process, but it may be formed of various materials such as silicon nitride, silicon oxide, silicon oxynitride, etc. Meanwhile, in consideration that the mask pattern 200 defines the upper conductive pattern 170, the mask pattern 200 is narrower than the lower conductive pattern 155. In order to embody the mask pattern 200 to have narrow width, the forming of the mask pattern 200 may include; forming a sacrificial pattern having a predetermined width on the gap-fill pattern 150; and reducing the width through isotropic etching process.

As illustrated in FIG. 24B, the mask pattern 200 is removed to expose the top surface of the floating gate pattern 180. The processes after removing the mask pattern 200 are identical to those of the previous embodiments, and thus their descriptions will be omitted herein.

According to the embodiments as mentioned above, the device isolation layer pattern is formed prior to the floating gate pattern. In comparison of a following embodiment with the previous embodiments, it is different in that the floating gate pattern is formed in advance before forming the device isolation layer patterns, which will be illustrated with reference to FIGS. 25A to 25E, and 26A to 26B. Herein, the descriptions illustrated previously will be omitted in order to avoid repeated illustration.

Figure 25A:
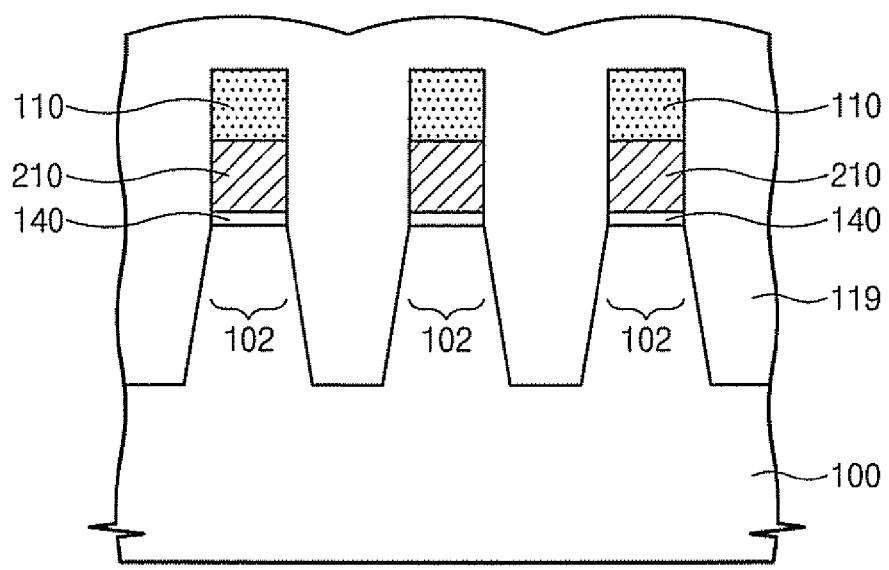
FIGS. 25A to 25E are cross-sectional views illustrating a method for fabricating a NAND flash memory device according to another embodiment of the present invention.

Referring to FIG. 25A, a gate insulating layer 140, a floating gate pattern 210, a trench mask pattern 110 are sequentially formed on a predetermined region of a semiconductor substrate 100. The semiconductor substrate 100 is etched using the mask pattern 110 as an etch mask to form a trench 105 defining the active region 102. Thereafter, a device isolation layer 119 filling a trench 105 is formed on the resultant structure in which the trench 105 is formed.

Figure 25B:
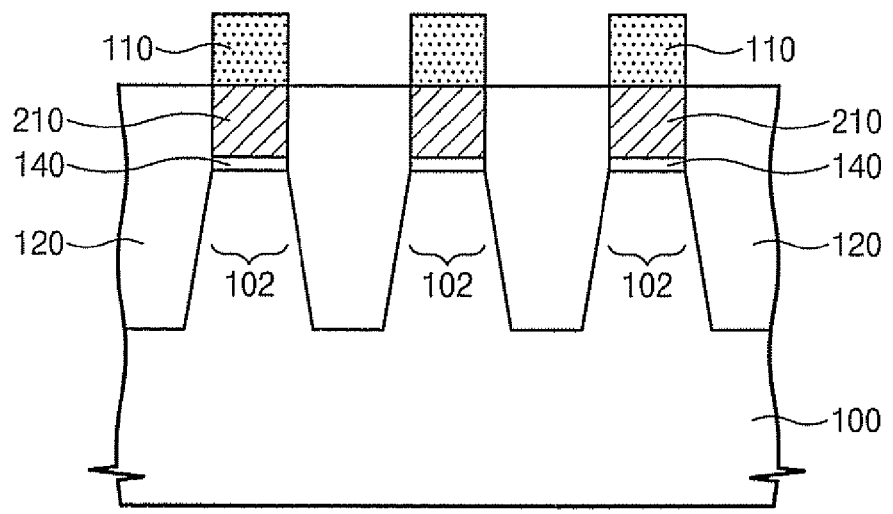

Referring to FIG. 25B, the device isolation layer pattern 119 is etched till the sidewall of the trench mask pattern 110 is exposed, thereby forming a device isolation layer pattern 120 to fill the trench 105. The forming of the device isolation layer pattern 120 may include: planarizing the deice isolation layer 119 till the trench mask pattern 110 is exposed; and etching the top surface of the device isolation layer pattern 120 till it is nearly equal in height to the top surface of the floating gate pattern 210.

Figure 25C:
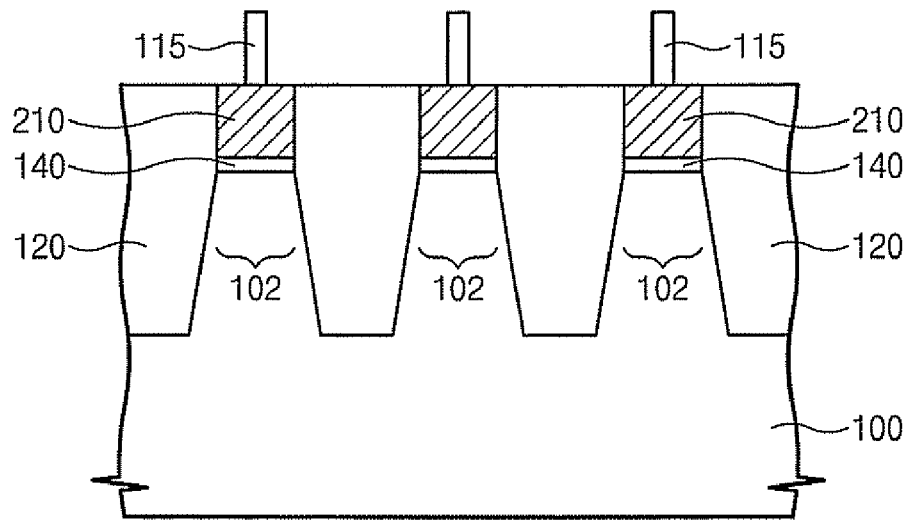

Referring to FIG. 25C, the exposed trench mask pattern 110 is isotropically etched so as to form a mask pattern 115 which is narrower than the floating gate pattern 210. The forming of the mask patterns 115 may be performed using wet etching process having an etch selectivity with respect to the device isolation layer patterns 120 and the floating gate pattern 210. In this case, the mask pattern 15 is self-aligned over the floating gate pattern 210, and the edges of the top surface of the floating gate patterns 210 are exposed.

Figure 25D:
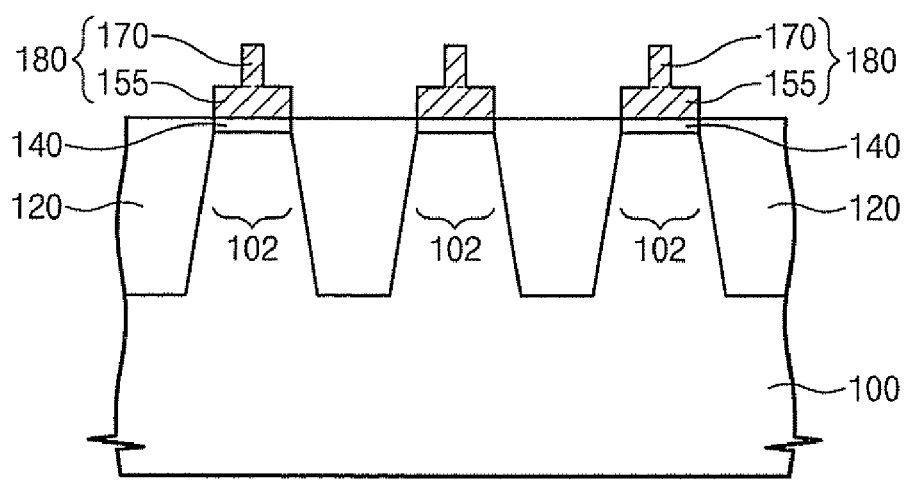

Referring to FIG. 25D, the exposed top surface of the floating gate pattern 210 is etched to a predetermined depth using a mask pattern 115, which is identical to the embodiment illustrated with reference to FIG. 5A. Resultingly, the etched floating gate pattern 180 has an inverted T-shaped section, wherein the upper conductive pattern 170 is narrower than the lower conductive pattern 155. Afterwards, the exposed top surface of the device isolation pattern is recessed till it is as high as the top surface of the gate insulating layer 140.

Figure 25E:
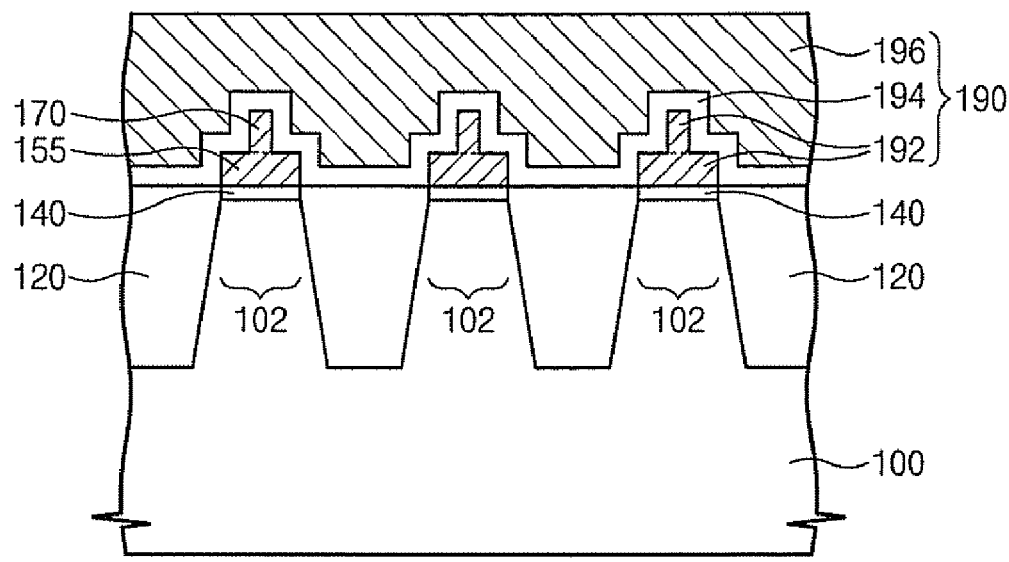

Referring to FIG. 25E, a gate interlayer insulating layer and a control gate conductive layer are formed over the floating gate pattern such that they covers the top surface of the floating gate pattern 180. Thereafter, the gate interlayer insulating layer and the control gate conductive layer are patterned so as to form a word line 190 which crosses over the active region 102. The forming of the word line 190 is the same as those of the previous embodiments.

In the embodiment as illustrated with reference to FIGS. 25A to 25E, after the process illustrated in FIG. 25B, a recessed region may be formed on the top surface of the device isolation layer pattern 120 by forming a spacer on the sidewall of the trench mask pattern 10. This will be more fully illustrated with reference to FIGS. 26A and 26B herebelow. In this case, since the shape of the spacer is transferred onto the device isolation layer pattern 120, it is possible to form the device isolation layer pattern 120 lower than the top surface of the active region 102 without the exposure of the gate insulating layer 140.

Figure 26A:
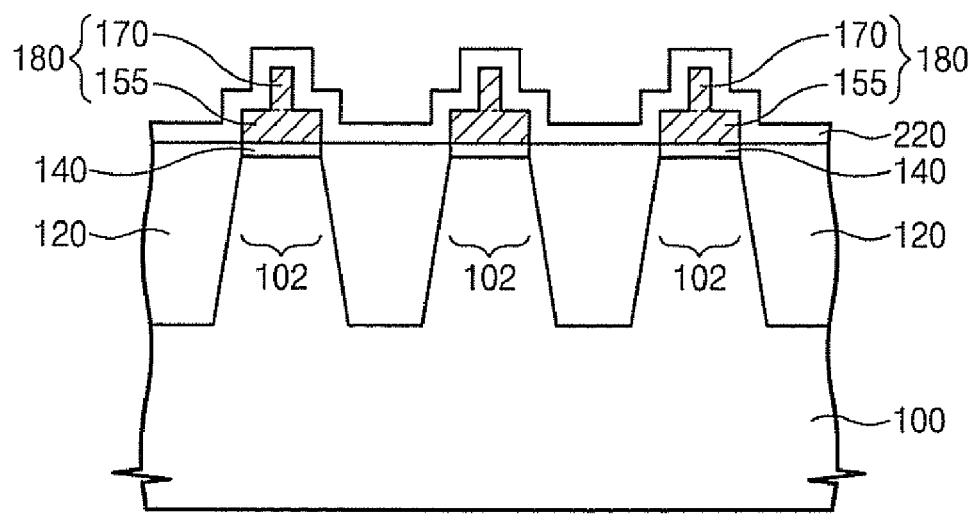
FIGS. 26A and 26B are cross-sectional views illustrating a method for fabricating a NAND flash memory device according to another embodiment of the present invention.
Figure 26B:
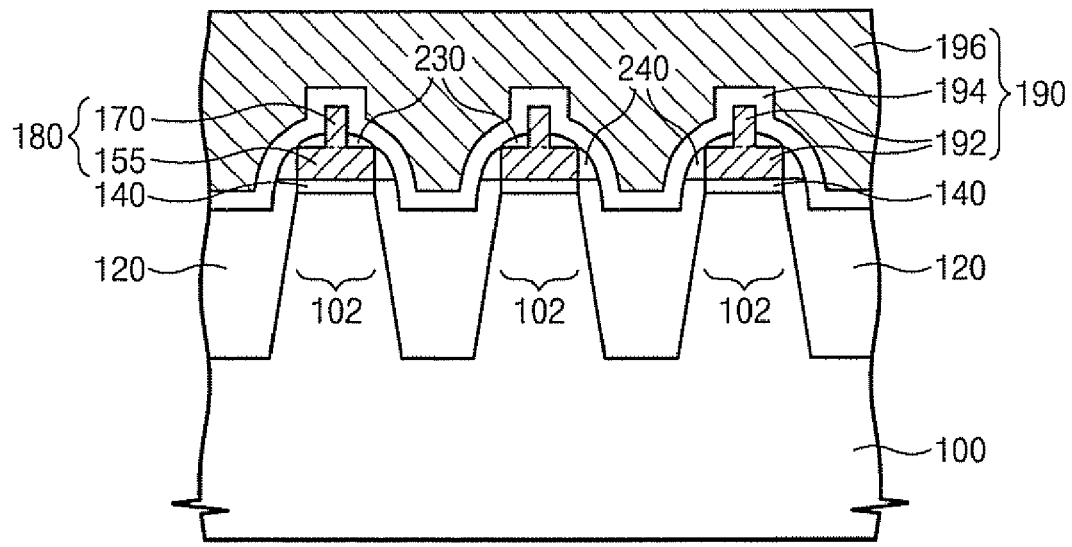

Referring to FIGS. 26A and 26B, the device isolation layer pattern 120 is recessed to a predetermined depth such that the gate insulating layer 140 is not exposed. Thereafter, a spacer insulating layer 220 is conformally formed on the resultant structure to cover the floating gate pattern 180, and thereafter, the spacer insulating layer 220 is anisotropically etched till the top surface of the upper conductive pattern 170 is exposed. At this time, the spacer insulating layer 220 may be at least one selected from the group consisting of silicon oxide layer, silicon nitride layer, silicon oxynitride layer and metal nitride layer.

Resultingly, a buffer insulating layer pattern 230 is formed on the lower conductive pattern 155, and a buffer spacer 240 is formed on the sidewall of the lower conductive pattern 155. Afterwards, a gate interlayer insulating layer and a control gate conductive layer are formed on the resultant structure in which the buffer insulating layer pattern 230 and the buffer spacer 240 are formed. Herein, the device isolation layer pattern 120 has a top surface lower than the top surface of the floating gate pattern 180 between the buffer spacers 240. Thereafter, a patterning process is performed to form a word line 190, which crosses over the active region 102. The forming of the word line 190 is the same as those of the previous embodiments. As a result, the buffer insulating layer pattern 230 is interposed between the top surface of the lower conductive pattern 155 and the bottom surface of the gate interlayer insulating layer pattern 194.

Figure 27A:
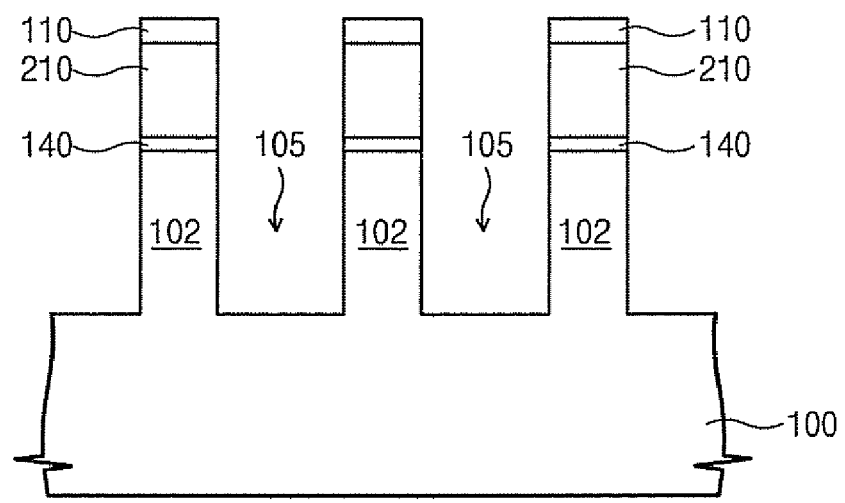
FIGS. 27A to 27E are cross-sectional views illustrating a method for fabricating a floating gate of a NAND flash memory device according to another embodiment of the present invention.

FIGS. 27A to 27E are cross-sectional views illustrating a method for forming a floating gate of a NAND flash memory according to another embodiment of the present invention Referring to FIG. 27A, a gate insulating layer 140, a floating gate pattern 210, and a mask pattern 110 are formed on a semiconductor substrate 100, and then a trench 105 for device isolation is formed. The substrate 100 under the floating gate pattern 210 becomes an active region 102. In more detail, a thin film deposition process is performed on the substrate 100 so as to form a gate insulating layer and a conductive layer for floating gate having a thickness in range of about 50 Angstroms to 100 Angstroms. Thereafter, the mask pattern 110 is formed on the conductive layer for floating gate to define the trench 105. Afterwards, the conductive layer for floating gate, the gate insulating layer, a portion of the substrate 100 are etched using the mask pattern 110 as an etch mask, thereby forming the floating gate pattern 210, the gate insulating layer pattern 140 and the active region 102. That is, the gate insulating layer pattern 140 and the floating gate pattern 210 are self-aligned on the active region 102. Herein, the trench 105 exposes the respective sidewalls of the floating gate pattern 210, the gate insulating layer pattern 140, and the active region 102.

The floating gate pattern 210, for example, may be formed of polysilicon. Because the thickness of the floating gate pattern 210 determines the height of the floating gate electrode, the floating gate pattern should have an appropriate thickness in consideration of coupling ratio, interference effect, etc. The mask pattern 110 may be formed of a material having an etch selectivity with respect to silicon and oxide layer. For instance, the mask pattern 110 may be formed of silicon nitride layer.

Figure 27B:
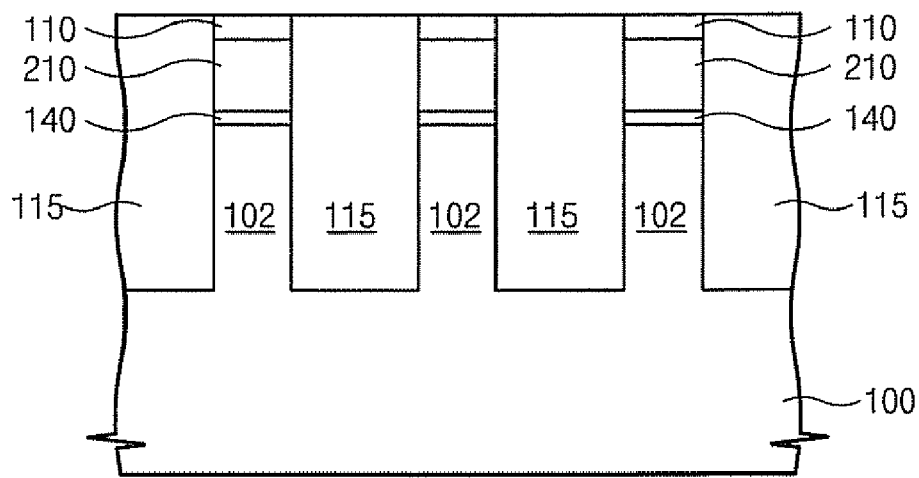

Referring to FIG. 27B, after forming an insulating layer for device isolation on the resultant structure to cover the sidewalls of the active region, the gate insulating layer pattern 140 and the floating gate pattern 210 such that it fills the trench 105 for device isolation, the insulating layer for device isolation is etched till the mask pattern 10 is exposed, thereby forming a device isolation layer 115. The etching process of the insulating layer for device isolation may be performed by CMP or etch-back process.

Figure 27C:
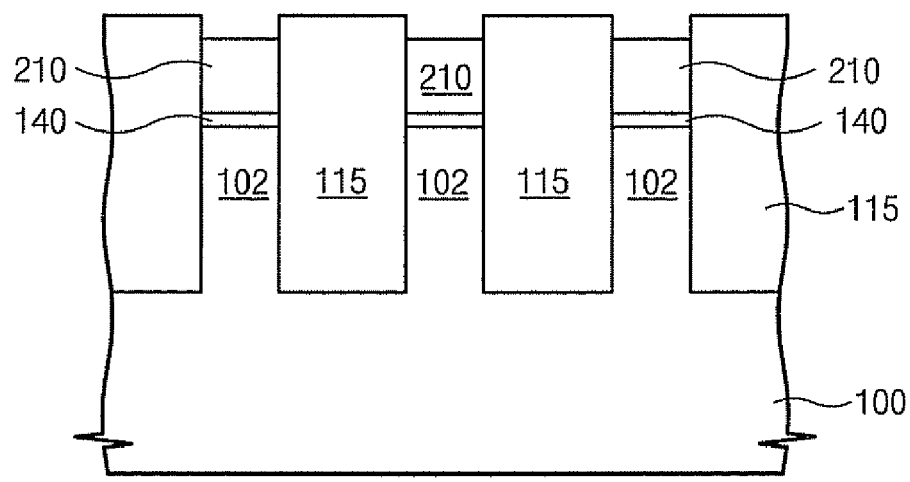

Referring to FIG. 27C, the exposed mask pattern 110 is removed to expose the top surface of the floating gate pattern 210. Since the mask pattern 110 is formed of a material having an etch selectivity with respect to the floating gate pattern 210 and the device isolation layer 115, the mask pattern 110 may be selectively removed.

Figure 27D:
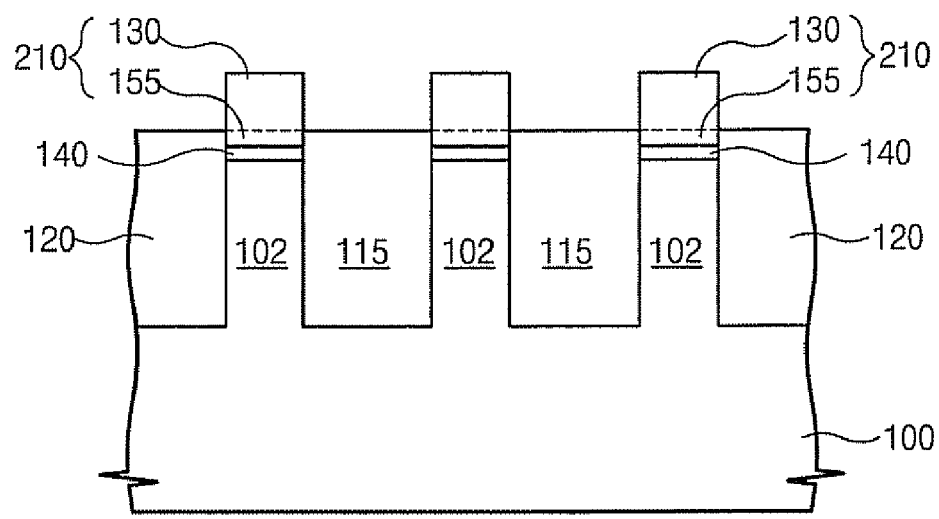

Referring to FIG. 27D, a portion of the device isolation layer 115 is removed in the inverted T-shaped gate region such that the side surface of the floating gate pattern 210 is exposed. Thus, there is formed a device isolation layer pattern 120 of which the top surface is lower than the top surface of the floating gate pattern 210. Herein, the floating gate pattern 210 may be divided into a region 155, which is covered with the device isolation layer pattern 120 (hereinafter, referred to as a lower pattern), and a region 130, which is not covered with the device isolation layer pattern 120 (hereinafter, referred to as an upper pattern). In the floating gate pattern 21, the lower pattern covered with the device isolation layer pattern 120 becomes a lower conductive pattern 155, whereas the upper pattern 130 is used for an upper conductive pattern of the floating gate electrode.

Herein, it does not matter which process is performed first between the process of removing the mask pattern 110 and the process of removing the portion of the device isolation layer 115.

Figure 27E:
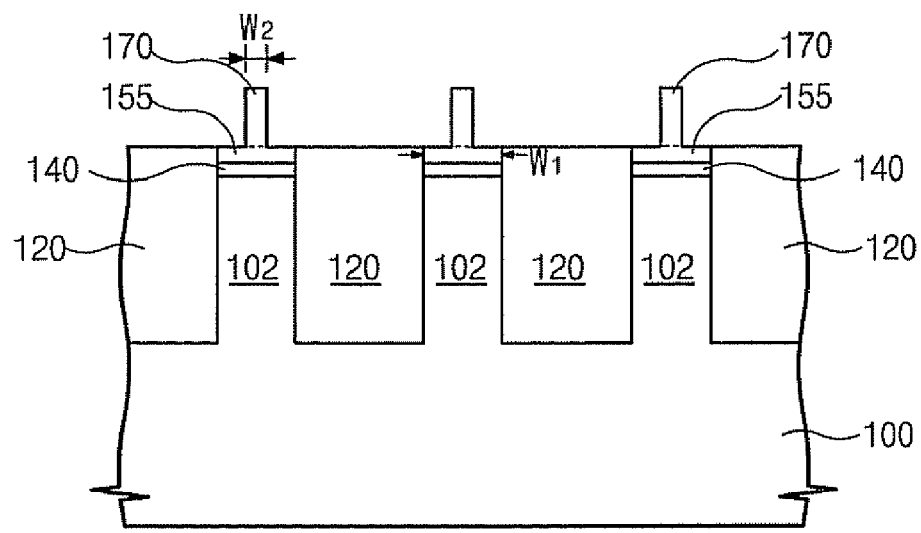

Referring to FIG. 27E, the upper pattern 130 of the floating gate pattern 210, which is higher than the device isolation layer pattern 120 is etched to form an upper conductive pattern 170 of the floating gate electrode. Herein, the upper conductive pattern 170 has a narrower width ($w_2$) than the width ($w_1$) of the upper pattern 130. In other words, the width ($w_2$) of the upper conductive pattern 170 is less than the width ($w_1$) of the lower conductive pattern 155. As a result, there is formed the floating gate pattern 180 configured with the lower conductive pattern 155, and the upper conductive pattern 170 of which the width is less than that of the lower conductive pattern 155. The etching of the upper pattern 130, for example, may be performed by wet etching process using etching solution. Alternatively, the upper pattern 130 may be etched through dry etching process using etching gas. In case of employing the wet etching process, the etching solution contains $NH_4OH$. Meanwhile, since the top surface as well as the side surface of the upper pattern 130 may be etched in case of using the etching solution, the thickness of the original floating gate pattern 210 should be determined in consideration that the top surface of the upper pattern 130 is etched away.

In the meantime, although the side surface of the lower conductive pattern 155 is protected because it is covered with the device isolation layer pattern 120, the edges of the top surface may be etched to some degree according to the process condition. In addition, the side surface of the upper conductive pattern 170 may have a vertical, inclined, flat, or slightly rugged surface according to the process condition. Further, the shape of the joint portion between the upper and lower conductive patterns 170 and 155 may have a smooth curve.

After forming the insulating layer for the gate interlayer insulating layer and the conductive layer for the control gate electrode, the conductive layer for the control gate, the gate interlayer insulating layer and the floating gate pattern 182 are patterned so as to complete the floating gate electrode 192 which is separated in every cell unit. Thereafter, the control gate electrode 194 is formed. The control gate electrode 196 is formed such that it crosses over the active region 102, and the floating gate electrode 192 is formed at every intersection of the control gate electrode 196 and the active region 102.

According to the method as illustrated above with reference to FIGS. 27A to 27E, the floating gate electrode is self-aligned on the active region. For example, the floating gate electrode is formed such that the lower conductive pattern of the floating gate electrode is substantially equal in width to the active region.

In the method as illustrated above with reference to FIGS. 27A to 27E, a thermal oxidation may be performed in order to address the etch damage produced during the etching process of forming the trench, prior to the forming process of the device isolation layer after forming the trench 105. In this case, the thermal oxidation is performed on the edges of the active region 102 so that the gate insulating layer is relatively formed thicker at the edges than the other regions of the active region 102.

In the method as illustrated above with reference to FIGS. 27A to 27E, the floating gate pattern may prevent the top surface of the upper pattern 130 from being etched. To this end, the process sequence may be controlled between the removal process of the mask pattern 10 and the etching process of the device isolation layer 115. For instance, the etching process may be performed on the upper pattern 130 of the floating gate pattern 210 in a state that the mask pattern 110 is not removed from the top surface of the floating gate pattern 210. This will be illustrated with reference to FIGS. 28A to 28C.

Figure 28A:
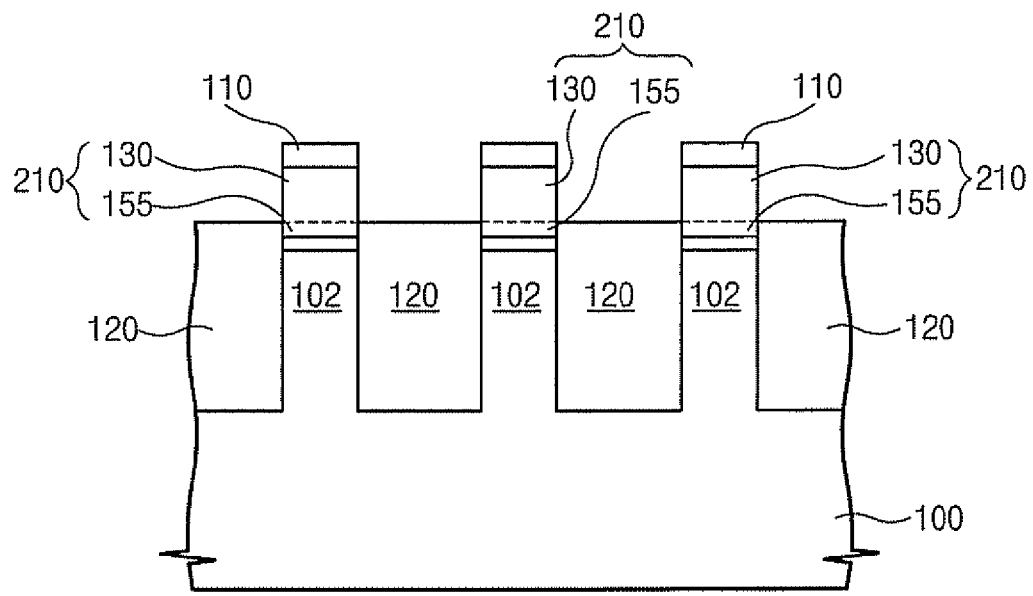
FIGS. 28A to 28C are cross-sectional views illustrating a method for fabricating a floating gate of a NAND flash memory device according to another embodiment of the present invention.

To being with, the processes of FIGS. 27A and 27B are performed so as to form a floating gate pattern 210, a gate insulating layer 140, a mask pattern 110, a device isolation layer 115. Referring to FIG. 28A, a portion of the device isolation layer 115 is etched in the inverted T-shaped gate region such that the side surface of the floating gate pattern 210 is exposed, thereby forming a device isolation layer pattern 120 of which the top surface is lower than the top surface of the floating gate pattern 210. Herein, the top surface of the floating gate pattern 210 is covered with the mask pattern 110.

Figure 28B:
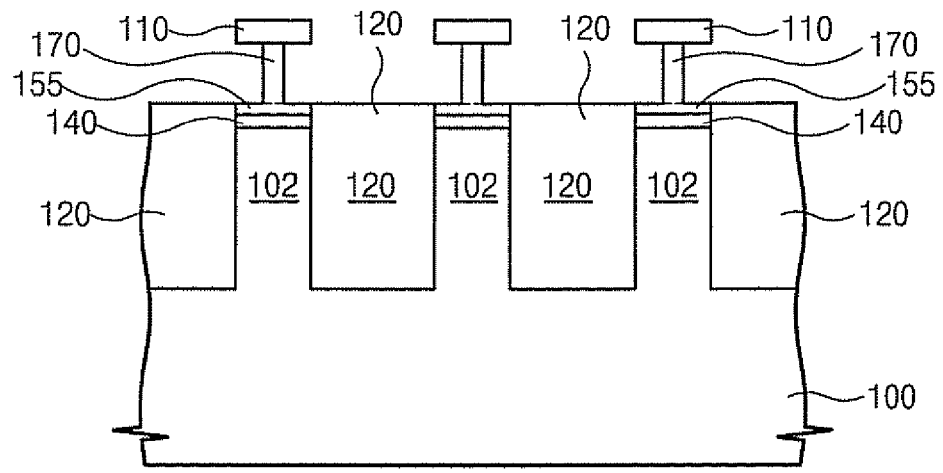

Referring to FIG. 28B, the side surface of the upper pattern 130 of the exposed floating gate pattern 210 is etched to reduce the width thereof, thereby form the upper conductive patter. In the embodiment of the present invention, the top surface of the upper pattern 130 is not etched unlike the method illustrated with reference to FIGS. 27A to 27E.

Figure 28C:
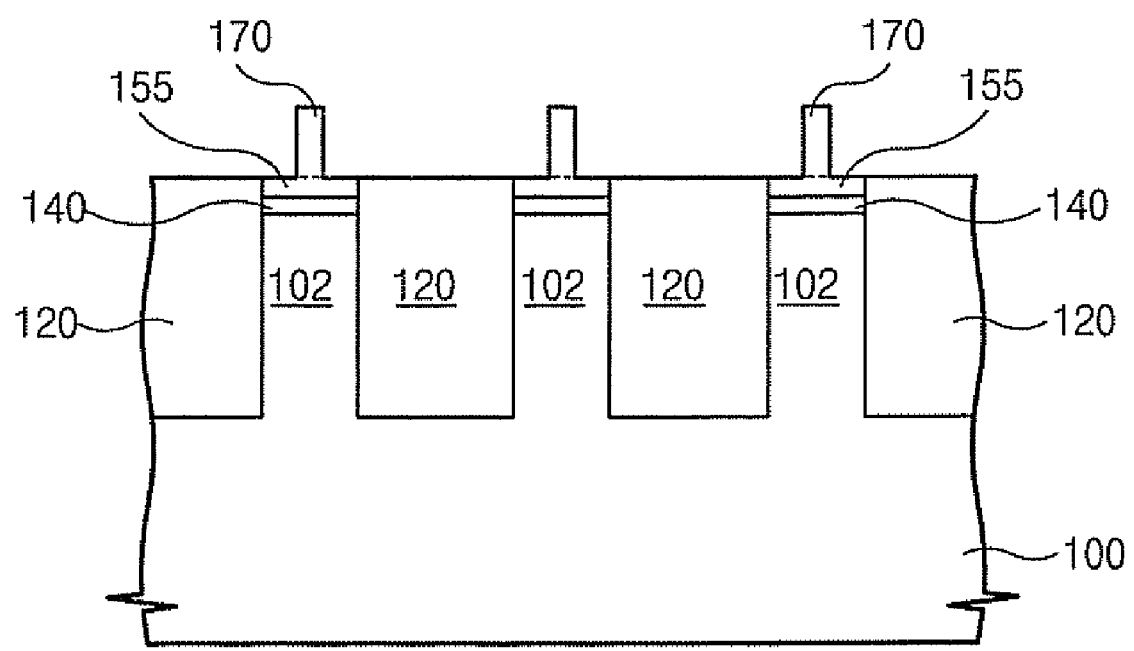

Thereafter, the mask pattern 110 is removed, as illustrated in FIG. 28C. In case of the embodiment of FIGS. 27A to 27E, the top surface of the upper pattern may be etched so that the edges of the top surface of the upper conductive pattern may be formed in shape of smooth curve. Whereas, in the embodiment of FIGS. 28A to 28C, since the top surface of the upper pattern is not etched in virtue of the mask pattern, the edges of the top surface of the upper conductive pattern may be formed in angular shape in comparison with the embodiment of FIGS. 27A to 27E.

According to the present invention, the gate of the select transistor has the box-shaped section in one region thereof and the inverted T-shaped section in the other region thereof. Therefore, it is possible to embody the select transistor with enhanced punchthrough characteristic, and leakage characteristic.

According to the present invention, because the portion of the gate of the select transistor is formed in the inverted T-shape when forming the floating gate of the memory transistor in the inverted T-shape, it is possible to prevent the active region from being etch-damaged in the region where the select transistor is formed while patterning the control gate.

According to the present invention, the floating gate electrode has the inverted T-shaped section. As a result, the cross-sectional area of the floating gate electrode may be reduced so that it is possible to minimize the interference effect between the adjacent to the word line. Since the decrease of the interference effect provides the process margin capable of increasing the surface area of the floating gate electrode, it is possible to increase the coupling ratio without the increase of the interference effect of the floating gate electrode according to the present invention. Resultingly, the nonvolatile memory device of the present invention can overcome the problems such as the electrical interference and the deterioration of the coupling ratio caused by the high integration of the device.

According to the present invention, since the floating gate electrode has the inverted T-shaped section, the distance between the upper conductive patterns of the floating gate electrodes may increase, wherein the floating gate electrodes are adjacent to each other in extension direction of the control gate. In addition, it is possible to the interference between the floating gate electrodes adjacent to each other in extension direction of the control gate.

Other characteristics, advantages or effects of the present invention may be understood from the accompanying drawings and illustration related therewith.

It will be apparent to those skilled in the art that various modifications and variations can be made in the present invention. Thus, it is intended that the present invention covers the modifications and variations of this invention provided they come within the scope of the appended claims and their equivalents.

What is claimed:

1. A semiconductor device comprising:
   a first gate formed on an active region of a substrate, wherein the active region is defined by device isolation layer patterns;
   a first insulating layer formed between the first gate and the active region; and
   first and second impurity regions formed on the active region on both sides of the first gate,
   wherein a first portion of the first gate adjacent to the first impurity region is different in cross-sectional shape from a second portion of the first gate adjacent to the second impurity region, wherein respective cross-sectional shapes of the first and second portions are defined by cross-sectional lines running between the first and second impurity regions and immediately adjacent thereto in a word line direction in the device;
   wherein the first portion of the first gate has substantially an inverted T-shaped section and the second portion of the first gate has a box-shaped section when taken along a direction crossing the active region and the device isolation layer patterns;
   wherein the first impurity region is lower in concentration than the second impurity region.

2. The semiconductor device of claim 1, wherein the substrate under the first portion of the first gate is higher in channel doping concentration than the substrate under the second portion of the first gate.

3. The semiconductor device of claim 1, further comprising:
   a second insulating layer formed on the first gate;
   a second gate penetrating through the second insulating layer such that it is electrically connected to the first gate; and
   a memory gate configured with a tunneling insulating layer, a floating gate, a gate interlayer insulating layer, and a control gate which are stacked on the active region in sequence, wherein the memory gate is spaced apart from the first gate.

4. The semiconductor device of claim 3, wherein the floating gate has an inverted T-shaped section when taken along a direction crossing the active region and the device isolation layer patterns.

5. The semiconductor device of claim 4, wherein the device isolation layer pattern adjacent to the floating gate of the memory gate is lower in height than the device isolation layer pattern adjacent to the first gate.

6. The semiconductor device of claim 4, wherein the first gate and the floating gate are formed from the same layer, and the second insulating layer and the gate interlayer insulating layer formed from the same layer, and the second gate and the control gate are formed from the same layer.

7. The semiconductor device of claim 4, wherein the top surface of the device isolation layer pattern adjacent to the floating gate is substantially equal in height to the top surface of a bar-shaped horizontal portion of the floating gate.

8. A NAND flash memory device comprising:
   a select transistor formed on an active region of a substrate, wherein the active region is defined by device isolation layer patterns; and
   a plurality of memory transistors formed on the active region, the plurality of memory transistors being connected to the select transistor in series,
   wherein the select transistor and each of the plurality of memory transistors comprise a stack gate structure configured with a first insulating layer, a first gate, a second insulating layer, and a second gate which are sequentially formed on the active region, in which the first gate of the memory transistor is substantially identical in cross-sectional shape to a first portion of the first gate of the select transistor adjacent to the memory transistor, and a second portion of the first gate of the select transistor opposite to the memory transistor is different in cross-sectional shape from the first portion of the first gate of the select transistor, wherein the first and second gates of the select transistor are electrically connected to one another; and
   wherein respective cross-sectional shapes of the first and second portions are defined by cross-sectional lines running between first and second impurity regions and immediately adjacent thereto in a word line direction in the device.

9. The NAND flash memory device of claim 8, wherein the first gate of the memory transistor has an inverted T-shaped section and the second portion of the first gate of the select transistor has a box-shaped cross-section when taken along a direction crossing the active region and the device isolation layer patterns.

10. The NAND flash memory device of claim 9, wherein the device isolation layer pattern adjacent to the first gate of the memory transistor is lower in height than the device isolation layer pattern adjacent to the first gate of the select transistor.

11. The NAND flash memory device of claim 9, wherein the top surface of the device isolation layer pattern adjacent to the first gate of the memory transistor is substantially equal in height to the top surface of a box-shaped horizontal portion of an inverted T-shaped first gate of the memory transistor.

12. The NAND flash memory device of claim 9, wherein a first impurity region adjacent to the first portion of the first gate of the select transistor is lower in concentration a second impurity region adjacent to the second portion of the first gate of the select transistor.

13. The NAND flash memory device of claim 9, wherein the substrate under the first portion of the first gate of the select transistor is lower in channel doping concentration than the substrate under the second portion of the first gate of the select transistor.

14. A semiconductor device comprising:
   a first gate formed on an active region of a substrate, wherein the active region is defined by device isolation layer patterns;
   a first insulating layer formed between the first gate and the active region; and
   first and second impurity regions formed on the active region on both sides of the first gate,
   wherein a first portion of the first gate adjacent to the first impurity region is different in cross-sectional shape from a second portion of the first gate adjacent to the second impurity region, wherein respective cross-sectional shapes of the first and second portions are defined by cross-sectional lines running between the first and second impurity regions and immediately adjacent thereto in a word line direction in the device;

wherein the first portion of the first gate has substantially an inverted T-shaped section and the second portion of the first gate has a box-shaped section when taken along a direction crossing the active region and the device isolation layer patterns;

wherein the substrate under the first portion of the first gate is higher in channel doping concentration than the substrate under the second portion of the first gate.

15. A semiconductor device comprising:

a first gate formed on an active region of a substrate, wherein the active region is defined by device isolation layer patterns;

a first insulating layer formed between the first gate and the active region; and first and second impurity regions formed on the active region on both sides of the first gate, wherein a first portion of the first gate adjacent to the first impurity region is different in cross-sectional shape from a second portion of the first gate adjacent to the second impurity region, wherein respective cross-sectional shapes of the first and second portions are defined by cross-sectional lines running between the first and second impurity regions and immediately adjacent thereto in a word line direction in the device;

wherein the first portion of the first gate has substantially an inverted T-shaped section and the second portion of the first gate has a box-shaped section when taken along a direction crossing the active region and the device isolation layer patterns;

a second insulating layer formed on the first gate;

a second gate penetrating through the second insulating layer such that it is electrically connected to the first gate; and a memory gate configured with a tunneling insulating layer, a floating gate, a gate interlayer insulating layer, and a control gate which are stacked on the active region in sequence, wherein the memory gate is spaced apart from the first gate.

* * * * *